(12) United States Patent
Tanaka

(10) Patent No.: US 7,829,419 B2
(45) Date of Patent: Nov. 9, 2010

(54) SEMICONDUCTOR DEVICE AND METHOD FOR MANUFACTURING THE SAME

(75) Inventor: Yoshinori Tanaka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 461 days.

(21) Appl. No.: 11/812,298

(22) Filed: Jun. 18, 2007

(65) Prior Publication Data

US 2007/0296045 A1 Dec. 27, 2007

(30) Foreign Application Priority Data

Jun. 26, 2006 (JP) .............................. 2006-175636

(51) Int. Cl.
*H01L 21/335* (2006.01)
(52) U.S. Cl. ...................... 438/279; 438/197
(58) Field of Classification Search ................ 438/279
See application file for complete search history.

(56) References Cited

U.S. PATENT DOCUMENTS

| 6,235,575 | B1 * | 5/2001 | Kasai et al. ............... 438/242 |
| 6,410,405 | B2 * | 6/2002 | Park .......................... 438/431 |
| 6,580,134 | B1 | 6/2003 | Song et al. |
| 6,624,036 | B2 | 9/2003 | Lee |
| 7,190,035 | B2 | 3/2007 | Ito |
| 2004/0161884 | A1 * | 8/2004 | Lee et al. .................... 438/197 |
| 2006/0292783 | A1 * | 12/2006 | Lee et al. .................... 438/199 |

FOREIGN PATENT DOCUMENTS

| JP | 6-21452 | 1/1994 |
| JP | 11-330233 | 11/1999 |
| JP | 2000-260952 | 9/2000 |
| JP | 2001-35983 | 2/2001 |
| JP | 2001-144290 | 5/2001 |
| JP | 2003-017693 | 1/2003 |
| JP | 2003-224208 | 8/2003 |
| JP | 2005-109346 | 4/2005 |
| JP | 2005-175299 | 6/2005 |

* cited by examiner

*Primary Examiner*—Bradley K Smith
*Assistant Examiner*—Mohammad Choudhry
(74) *Attorney, Agent, or Firm*—Young & Thompson

(57) ABSTRACT

A semiconductor device is provided with a semiconductor substrate, a plurality of active regions separated from each other by element isolation regions formed on the semiconductor substrate; gate oxide films formed on the active regions; gate electrodes formed on the gate oxide films; side wall insulation films formed on side surfaces of the gate electrodes; recessed parts formed in exposed surfaces of the active regions excluding regions that are covered by the gate electrodes and the side wall insulation films; dam insulation films provided to a periphery of the recessed parts; and silicon epitaxial layers formed within the recessed parts.

5 Claims, 40 Drawing Sheets

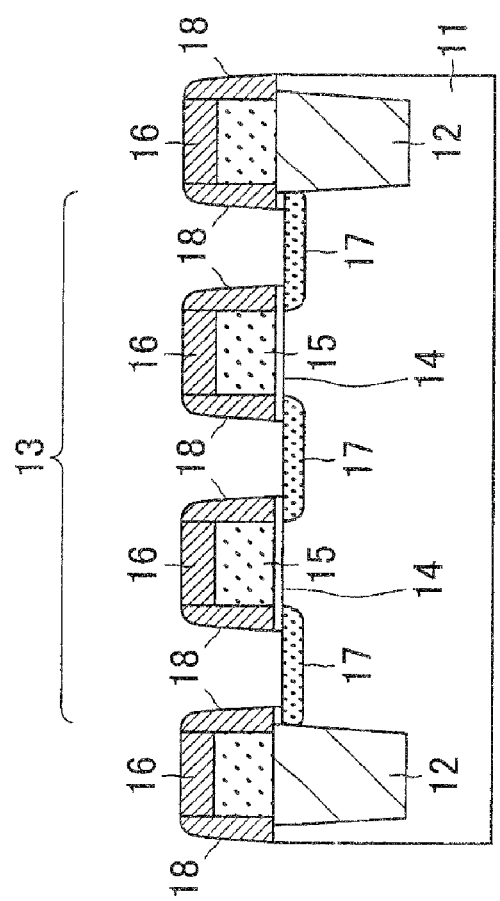
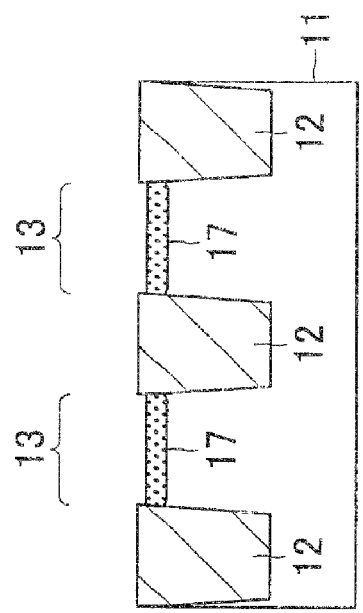
FIG.6A
FIG.6B

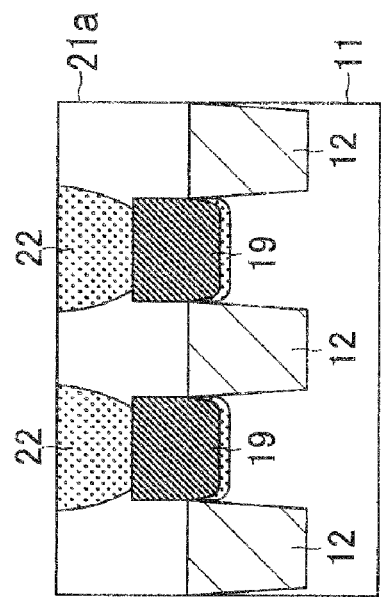
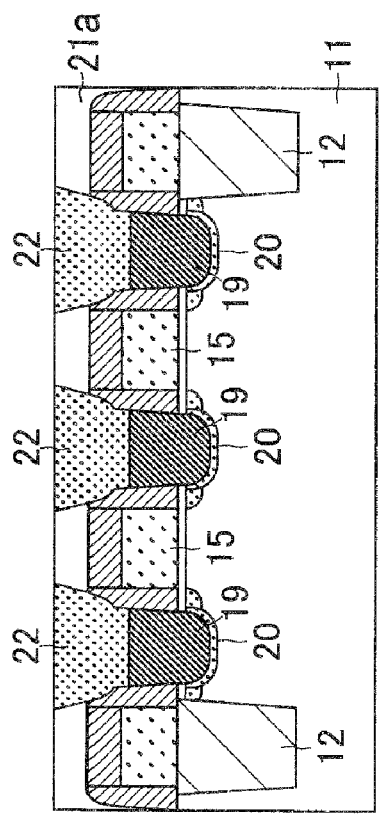
FIG.10A
FIG.10B

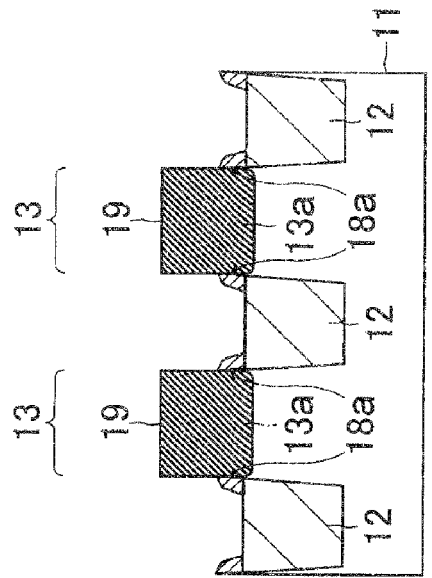
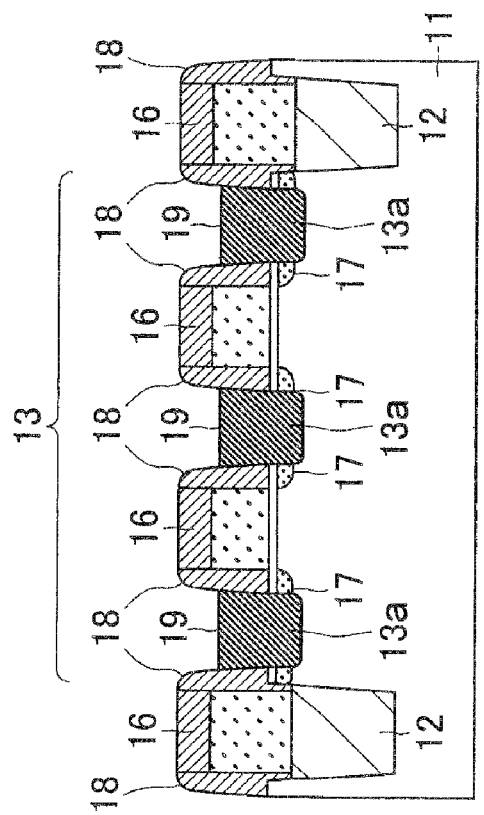
FIG. 28A
FIG. 28B

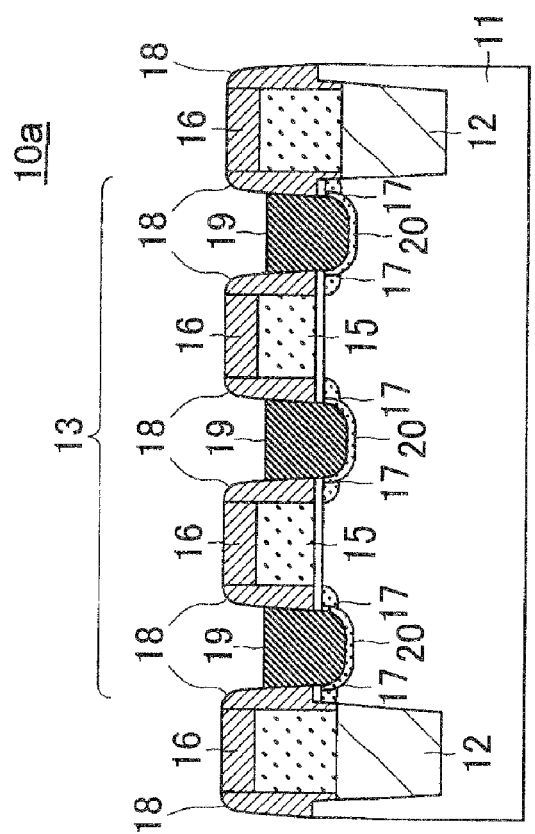
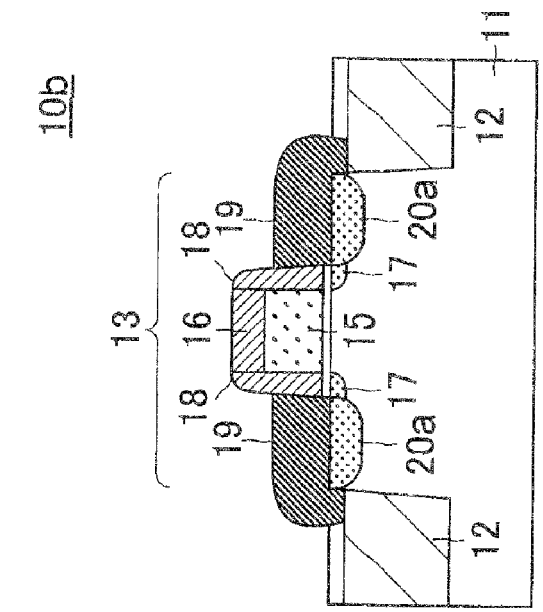
FIG.31A
FIG.31B

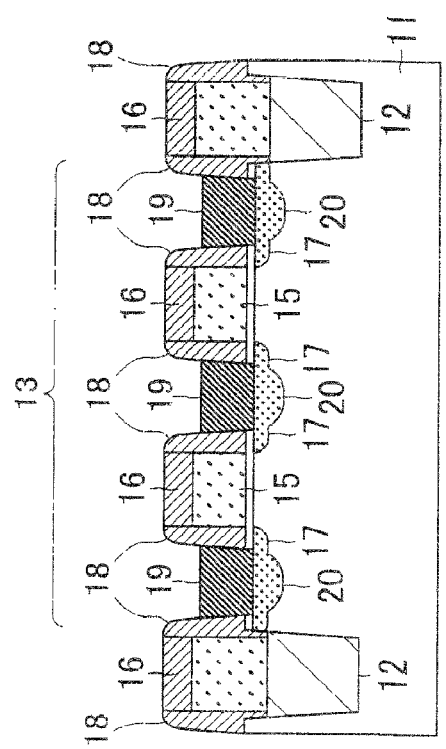
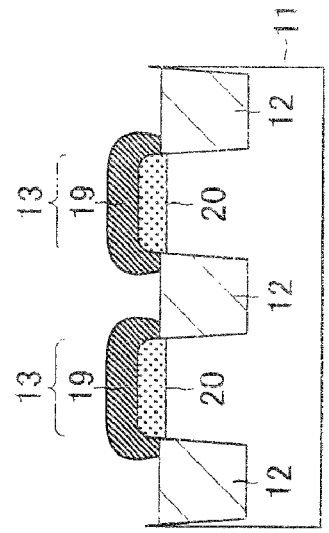
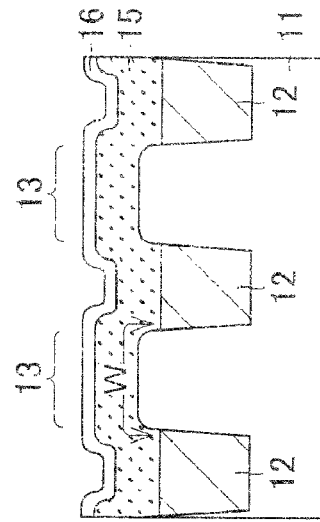
FIG. 40A PRIOR ART
FIG. 40B PRIOR ART
FIG. 40C PRIOR ART

SEMICONDUCTOR DEVICE AND METHOD FOR MANUFACTURING THE SAME

TECHNICAL FIELD

The present invention relates to a semiconductor device and to a method for manufacturing the same, and particularly relates to a semiconductor device having a structure in which an epitaxial layer is formed on the source/drain region, and to a method for manufacturing the device.

BACKGROUND OF THE INVENTION

Recent reductions in the field pitch of DRAM cells have been accompanied by difficulties in maintaining the channel width W of memory cell transistors, which have led to reduced transistor characteristics and adverse effects on read characteristics, refresh characteristics, and other important characteristics of DRAM. Miniaturization of DRAM cells has also caused the aspect ratio of vertical transistors to increase, and resulted in significant problems such as increased contact resistance or connection defects between cell contacts and source/drain regions, and reduced processing margins in SAC (Self Align Contact) or etching. The field pitch of the currently mass-produced DRAM having a cell area of $6F^2$ has recently been reduced to less than that of identically designed DRAM having a cell area of $8F^2$. Therefore, maintaining the transistor characteristics has become even more rigorous.

Therefore, a method has recently been proposed in which the active region is caused to protrude beyond the element isolation region, and the side surfaces of the active region thus formed are utilized to maintain the channel width W (see Japanese Laid-open Patent Application No. 2001-35983). This method makes it possible to maintain a wider channel width W while the field pitch remains constant. In other words, the field pitch can be significantly reduced without adversely affecting the transistor characteristics.

A method has also been proposed in which a silicon substrate is built up by selective epitaxial growth (SEG) to form a silicon epitaxial layer on the source/drain regions (see Japanese Laid-open Patent Application No. 2005-109346). This method makes it possible to ensure an electrical connection between the source/drain regions and the cell contacts, suppress short-channel effects in a memory cell transistor, and suppress increases in contact resistance or bit-line capacity (Cb).

However, since selective epitaxial growth is a technique for selectively growing silicon crystals on a silicon substrate, there is a risk of short-circuiting between adjacent epitaxial layers, depending on the direction of silicon crystal growth. Particularly in a silicon substrate having protruding active regions, growth progresses in the transverse direction of the silicon epitaxial layer in the side surfaces of the active regions, and short-circuiting easily occurs between adjacent silicon epitaxial layers.

FIG. 39 is a schematic plain view showing the planar layout of a conventional DRAM cell transistor; FIG. 40A is a schematic cross-sectional view along line P-P in FIG. 39; FIG. 40B is a schematic cross-sectional view along line Q-Q in FIG. 39; and FIG. 40C is a schematic cross-sectional view along line R-R in FIG. 39.

As shown in FIG. 39, the active regions 13 on the silicon substrate 11 are elongated narrow island regions encircled by element isolation regions 12, and the longitudinal direction of the active regions 13 is at a prescribed angle in relation to the direction (X direction) orthogonal to the wiring direction of the word lines (gate electrodes) 15. The plurality of active regions 13 is arranged in a straight line in the longitudinal direction thereof, and is also arranged at equal intervals in relation to the wiring direction (Y direction) of the word lines 15. As shown in FIGS. 40A through 40C, the surfaces of the active regions 13 protrude beyond the element isolation regions 12, and the lateral surface portions of the active regions 13 are utilized to maintain a wider channel width W. The active regions 13 shown in the drawings are rounded active regions whose side surfaces have a gradual rise.

As shown in the drawings, impurity diffusion regions are formed on the exposed surfaces of the active regions 13 not covered by the word lines 15, but silicon epitaxial layers 19 are formed directly above the impurity diffusion regions, and cell contacts 22 are formed directly thereon. Furthermore, bit lines 24 extending in the X direction are wired in a layer above the cell contacts 22. The bit lines are wired in meandering fashion so as to pass over the cell contacts 22 at the center of the active regions 13 and to avoid the cell contacts 22 at the both ends of the active regions 13.

As shown in FIG. 40B, when the side surfaces of the active regions 13 are exposed, the silicon epitaxial layers easily grow not only in the direction perpendicular to the substrate surface, but also in the parallel direction (Y direction). When the silicon epitaxial layers grow in this fashion, there is a risk of short-circuiting between adjacent silicon epitaxial layers 19, 19. It may appear that this problem can be overcome by stopping the growth of the silicon epitaxial layers before short-circuiting occurs between the silicon epitaxial layers 19, 19, but an adequate thickness of the silicon epitaxial layers 19 cannot be maintained in this case, and it becomes difficult to suppress short-channel effects in the memory cell transistor. There is therefore a need for a new method for reliably preventing short-circuiting between silicon epitaxial layers that are adjacent to each other.

SUMMARY OF THE INVENTION

Therefore, an object of the present invention is to provide a structure of a semiconductor device that is capable of preventing short-circuiting between adjacent silicon epitaxial layers when the silicon epitaxial layers are formed on impurity diffusion regions.

Another object of the present invention is to provide a method for manufacturing a semiconductor device that is capable of preventing short-circuiting between adjacent silicon epitaxial layers when the silicon epitaxial layers are formed on impurity diffusion regions.

The above and other objects of the present invention can be accomplished by a semiconductor device comprising a semiconductor substrate, a plurality of active regions separated from each other by element isolation regions formed on the semiconductor substrate; gate oxide films formed on the active regions; gate electrodes formed on the gate oxide films; side wall insulation films formed on side surfaces of the gate electrodes; recessed parts formed in exposed surfaces of the active regions excluding regions that are covered by the gate electrodes and the side wall insulation films; dam insulation films provided to a periphery of the recessed parts; and silicon epitaxial layers formed within the recessed parts. As described hereinafter, the term "dam insulation film" used herein refers to an insulation film that acts as a barrier for physically deterring the growth in the transverse direction of the silicon epitaxial layers.

In the present invention, the active regions are preferably shaped so as to protrude beyond the element isolation regions. When the active regions protrude in this manner, the side surface portions of the active regions make it easier for the silicon epitaxial layers to grow in the transverse direction, but it is possible even in this case to suppress the growth of the silicon epitaxial layers in the transverse direction, and to prevent short-circuiting between adjacent silicon epitaxial layers. Specifically, significant effects can be obtained by the present invention when the active regions protrude in this manner. The active regions may be pillar-shaped active regions or rounded active regions. When the active regions are pillar-shaped, the dam insulation films are preferably composed of the same insulation material and formed at the same time as the side wall insulation films. When the active regions are round, the dam insulation films are preferably composed of the insulation material that forms the element isolation regions.

The abovementioned objects of the present invention are also achieved by a method for manufacturing a semiconductor device, comprising an element isolation step for forming element isolation regions on a silicon substrate; a gate oxide film formation step for forming gate oxide films on a plurality of active regions separated from each other by the element isolation regions; a gate electrode formation step for forming gate electrodes on the gate oxide films; a side wall insulation film formation step for forming side wall insulation films on side surfaces of the gate electrodes; a deepening step for forming recessed parts in exposed surfaces of the active regions excluding regions covered by the gate electrodes and the side wall insulation films; and an epitaxial layer formation step for forming epitaxial layers on exposed surfaces of the active regions in which the recessed parts are formed.

In the present invention, the element isolation step preferably includes a step for deepening the element isolation regions so that the active regions protrude beyond the element isolation regions. Such a step makes it possible to form pillar-shaped or rounded active regions and maintain a wide channel width. The active regions have both plane surfaces and side surfaces, and the silicon epitaxial layers therefore easily grow in the transverse direction. It is possible even in this case to suppress the growth of the silicon epitaxial layers in the transverse direction, and to prevent short-circuiting between adjacent silicon epitaxial layers. Specifically, significant effects can be obtained by the present invention when the active regions protrude in the above-described manner.

In the present invention, the deepening step preferably includes a step for deepening the exposed surfaces of the active regions so that the exposed surfaces are lower than the dam insulation films that are formed at the same time as the side wall insulation films on the periphery of the active regions. When the insulation material that remains during formation of the side wall insulation films is used to form dam insulation films in this manner, the desired amount of deepening can be maintained without making the active regions lower than the element isolation regions.

In the present invention, the element isolation step preferably further includes a step for rounding the corner portions of the active regions. Rounded active regions can thereby be formed, and the insulation withstand voltage of the gate oxide films can be enhanced in comparison to a case in which the active regions are pillar-shaped. In this case, the deepening step preferably includes a step for making the exposed surfaces of the active regions lower than the element isolation regions. The side surface portions of the element isolation regions can thereby be utilized as dam insulation films.

The present invention preferably includes a step for forming memory regions and peripheral circuit regions at substantially the same time, wherein the deepening step is applied only to the memory regions. The area of the silicon epitaxial layers in the planar direction thereof can thereby be increased, and an adequate superposition margin can be maintained with respect to metal contacts in the peripheral circuit regions.

In the present invention, the element isolation regions on the periphery of the active regions, or the insulation films that remain on the periphery of the active regions when the side wall insulation films are formed, form part of a wall that covers the periphery of the exposed surfaces of the active regions not covered by the gate electrodes and side wall insulation films, and function as dam insulation films that prevent growth of the silicon epitaxial layers in the transverse direction. Therefore, short-circuiting between adjacent silicon epitaxial layers can be prevented even when the active regions are pillar-shaped active regions or rounded active regions.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 6A is a schematic cross sectional view along line P-P in FIG. 1 showing the process for manufacturing the DRAM array (specifically forming side wall insulation films) according to the first embodiment of the present invention;

FIG. 6B is a schematic cross sectional view along line Q-Q in FIG. 1 showing the process for manufacturing the DRAM array (specifically forming side wall insulation films) according to the first embodiment of the present invention;

FIG. 10A is a schematic cross sectional view along line P-P in FIG. 1 showing the process for manufacturing the DRAM array (specifically forming cell contacts) according to the first embodiment of the present invention;

FIG. 10B is a schematic cross sectional view along line Q-Q in FIG. 1 showing the process for manufacturing the DRAM array (specifically forming cell contacts) according to the first embodiment of the present invention;

FIG. 28A is a schematic cross sectional view along line P-P in FIG. 1 showing the process for manufacturing the DRAM array (specifically forming silicon epitaxial layer) according to the second embodiment of the present invention;

FIG. 28B is a schematic cross sectional view along line Q-Q in FIG. 1 showing the process for manufacturing the DRAM array (specifically forming silicon epitaxial layer) according to the second embodiment of the present invention;

FIG. 31A is a schematic cross sectional view along line P-P in FIG. 1 showing the process for manufacturing the DRAM array according to the second embodiment of the present invention;

FIG. 31B is a schematic cross sectional view along line Q-Q in FIG. 1 showing the process for manufacturing the DRAM array according to the second embodiment of the present invention;

FIG. 40A is a schematic cross-sectional view along line P-P in FIG. 39;

FIG. 40B is a schematic cross-sectional view along line Q-Q in FIG. 39; and

FIG. 40C is a schematic cross-sectional view along line R-R in FIG. 39.

DETAILED DESCRIPTION OF THE EMBODIMENTS

Preferred embodiments of the present invention will now be described in detail hereinafter with reference to the accompanying drawings.

Figure 1:
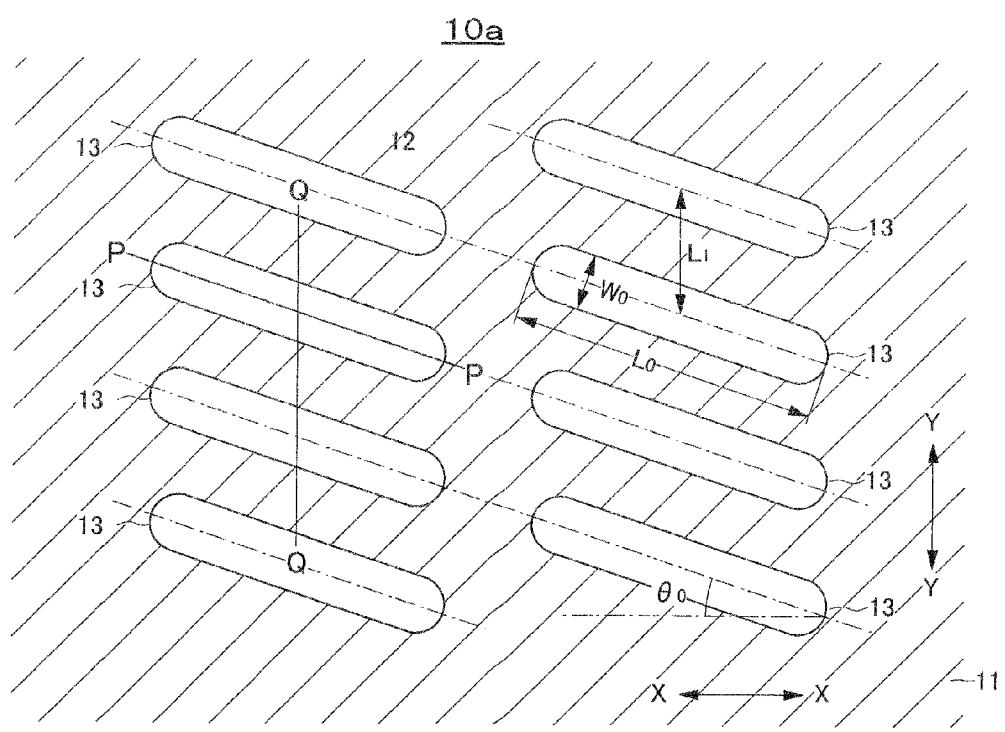
FIG. 1 is a schematic plain view showing the process for manufacturing the memory array region in DRAM (a planar layout of active regions) as an example of the semiconductor device according to a first embodiment of the present invention.
Figure 11:
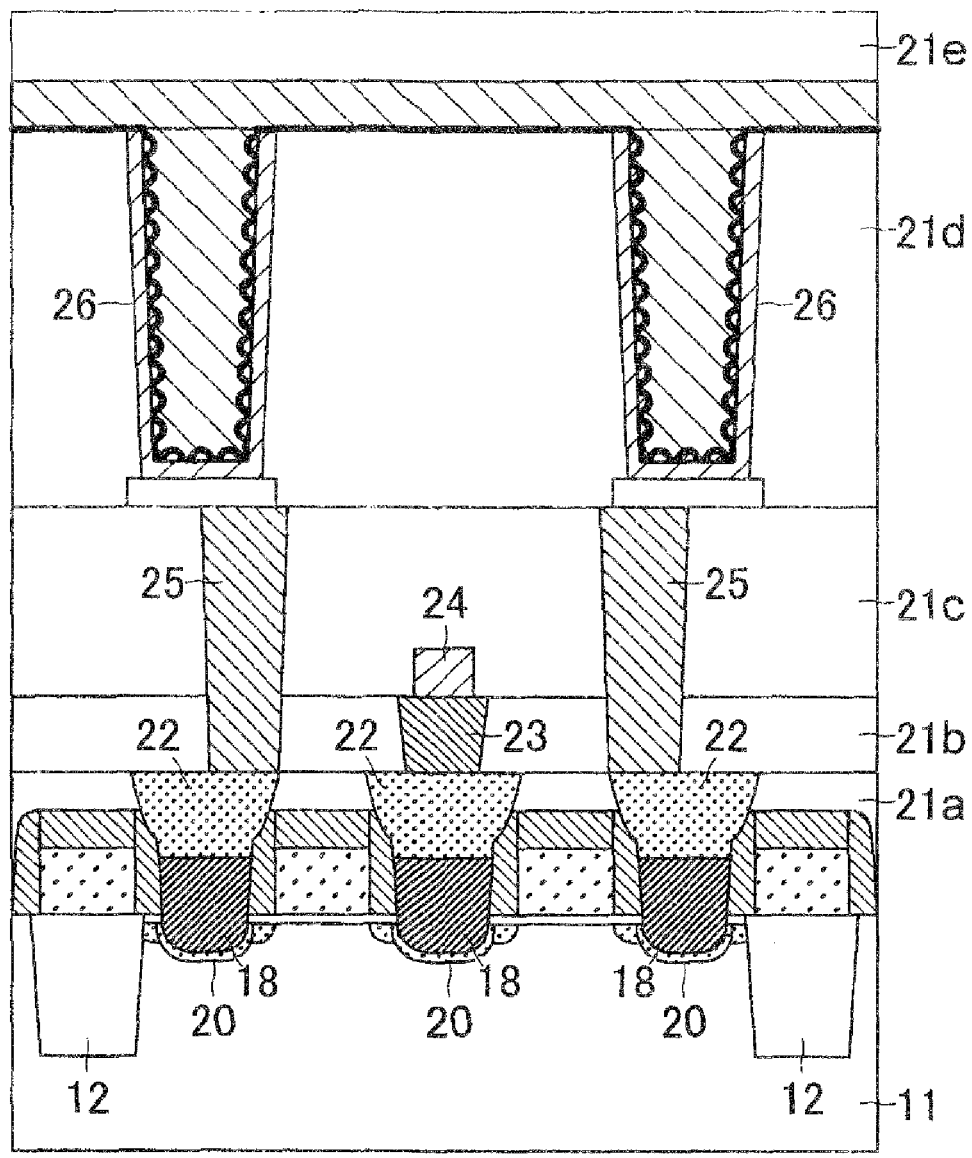
FIG. 11 is a schematic cross sectional view along line P-P in FIG. 1 showing the process for manufacturing the DRAM array (specifically forming storage capacitors) according to the first embodiment of the present invention.

FIGS. 1 through 11 are diagrams showing the process for manufacturing the memory array region in DRAM as an example of the semiconductor device according to a first embodiment of the present invention. FIG. 1 is a schematic plain view, and FIGS. 2 through 11 are schematic cross sectional views. Specifically, FIG. 1 shows the planar layout of the active regions; FIG. 11 and the "A" diagrams in FIGS. 2 through 10 are sectional views along line P-P in FIG. 1; and the "B" diagrams in FIGS. 2 through 10 are sectional views along line Q-Q in FIG. 1.

Figure 2B:
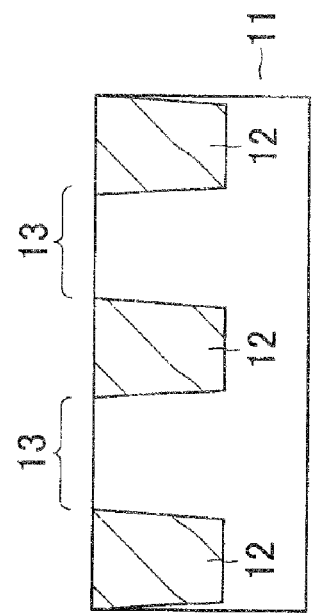
FIG. 2B is a schematic cross sectional view along line Q-Q in FIG. 1 showing the process for manufacturing the DRAM array (specifically forming element isolation regions) according to the first embodiment of the present invention.
Figure 2A:
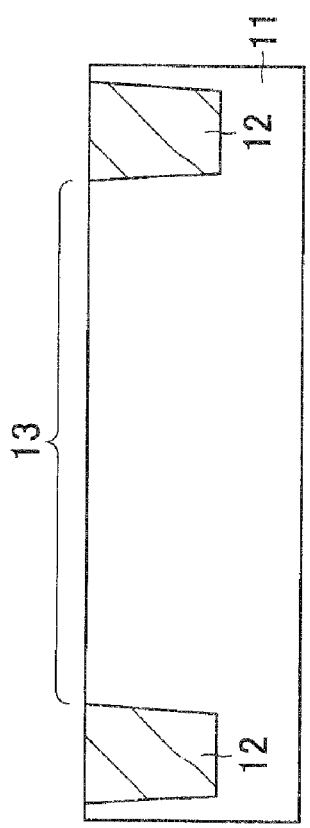
FIG. 2A is a schematic cross sectional view along line P-P in FIG. 1 showing the process for manufacturing the DRAM array (specifically forming element isolation regions) according to the first embodiment of the present invention.

In the manufacture of the memory array 10a of a DRAM 10, element isolation regions 12 are first formed by STI (Shallow Trench Isolation) or another method on a p-type silicon substrate 11 as shown in FIGS. 1, 2A, and 2B, and a plurality of active regions 13 that are separated from each other by the element isolation regions 12 is formed. As shown in FIG. 1, the active regions 13 are elongated island regions surrounded by the element isolation regions 12, and the longitudinal direction of the active regions 13 is angled approximately 18 degrees in relation to the direction (X direction) orthogonal to the wiring direction of the word lines described hereinafter. The active regions are aligned on a straight line in the longitudinal direction of the active regions 13, and are also arranged at equal intervals with respect to the wiring direction (Y direction) of the word lines. The angle $\theta_0$ formed by the active regions 13 and the X direction is preferably approximately 18 degrees. When the active regions are aligned with a straight line that forms an angle of approximately 18 degrees with the X direction, an optimized $6F^2$ layout can be achieved. In the preferred configuration, the width $W_0$ of the active regions 13 is set to approximately 1F ("F" is the minimum feature size), the length $L_0$ of the active regions 13 is set to approximately 5.1F, and the distance $L_1$ between centers of active regions 13, 13 that are adjacent in the Y direction is set to approximately 2F.

The element isolation regions 12 are formed by a process in which grooves having a depth of approximately 0.3 μm are formed by dry etching in the principal surface of a p-type silicon substrate 11, and a thin silicon oxide film is formed by thermal oxidation at approximately 1000° C. on the entire surface of the substrate including the inner walls of the grooves, after which a silicon oxide film (field oxide film) having a thickness of 400 to 500 nm is deposited by CVD (Chemical Vapor Deposition) on the entire surface of the substrate, including the insides of the grooves. The unnecessary field oxide film on the silicon substrate 11 is then removed by CMP (Chemical Mechanical Polishing), and the element isolation regions 12 are formed by allowing the field oxide film to remain only in the grooves.

Figure 3A:
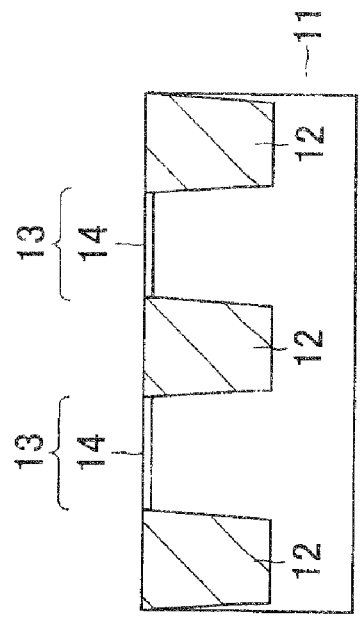
FIG. 3A is a schematic cross sectional view along line P-P in FIG. 1 showing the process for manufacturing the DRAM array (specifically forming gate oxide films) according to the first embodiment of the present invention.
Figure 3B:
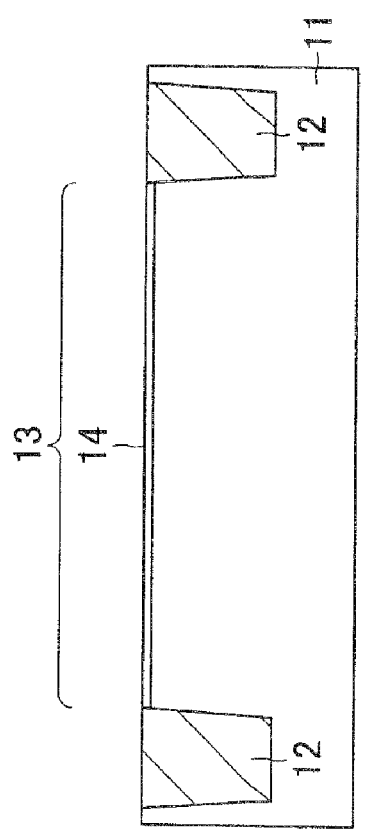
FIG. 3B is a schematic cross sectional view along line Q-Q in FIG. 1 showing the process for manufacturing the DRAM array (specifically forming gate oxide films) according to the first embodiment of the present invention.

As shown in FIGS. 3A and 3B, gate oxide films 14 are then formed on the surfaces of the active regions 13. In the formation of the gate oxide films 14, a thin silicon oxide film (sacrificial oxide film) is first formed on the surfaces of the active regions 13 by thermal oxidation, and the sacrificial oxide film is removed, whereby damage on the surfaces of the active regions 13 is repaired. The gate oxide films 14 are then formed by thermally oxidizing the active regions 13 at 800 to 1100° C. to form silicon oxide films having a thickness of about 6 to 8 nm.

Figure 4B:
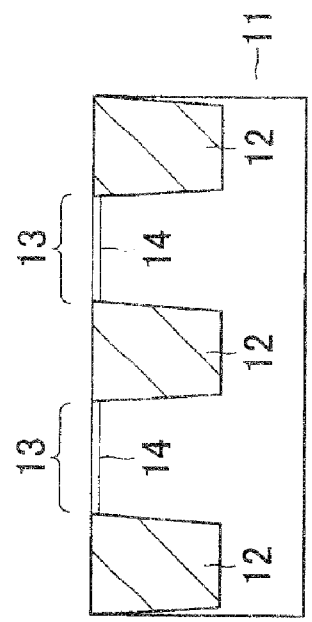
FIG. 4B is a schematic cross sectional view along line Q-Q in FIG. 1 showing the process for manufacturing the DRAM array (specifically forming gate electrodes) according to the first embodiment of the present invention.
Figure 4A:
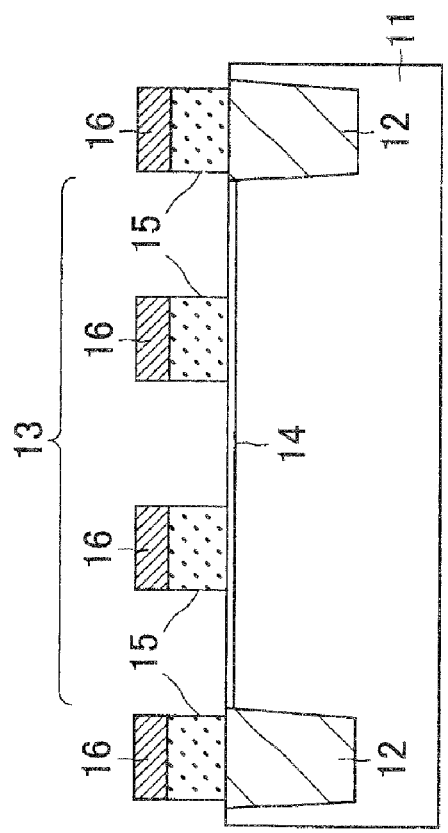
FIG. 4A is a schematic cross sectional view along line P-P in FIG. 1 showing the process for manufacturing the DRAM array (specifically forming gate electrodes) according to the first embodiment of the present invention.

As shown in FIGS. 4A and 4B, the gate electrodes 15 of the memory cell transistor are then formed as the word lines of the DRAM array, and gate cap insulation films 16 for protecting the upper surfaces of the gate electrodes 15 are formed. The gate electrodes 15 and the gate cap insulation films 16 are formed by a process in which a conducting film composed of a DOPOS (Doped Polysilicon) film having a thickness of approximately 70 nm, a tungsten silicide film having a thickness of approximately 5 nm, a tungsten nitride film having a thickness of 5 to 10 nm, and a tungsten film having a thickness of 30 to 60 nm layered in sequence is first formed on the entire substrate surface on which the gate oxide films 14 are formed, and silicon nitride films are then formed to serve as the gate cap insulation films 16. A plurality of gate electrodes 15 and gate cap insulation films 16 extending in the Y direction is then formed by patterning the multilayer films in linear fashion. Thin silicon oxide films (not shown) are then formed on the side surfaces of the DOPOS films by light oxidation of the patterned gate electrodes 15. In the light oxidation process, it is possible to use selective oxidation conditions whereby the DOPOS films and the silicon substrate are selectively oxidized without oxidizing the tungsten nitride film and the tungsten film.

Figure 5B:
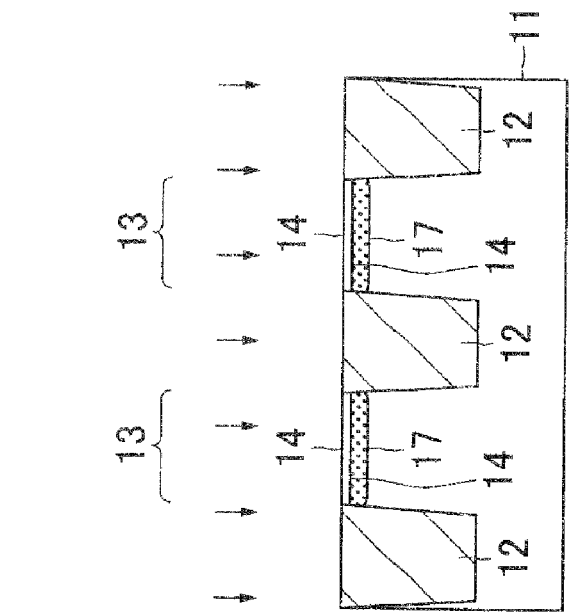
FIG. 5B is a schematic cross sectional view along line Q-Q in FIG. 1 showing the process for manufacturing the DRAM array (specifically forming LDD regions) according to the first embodiment of the present invention.
Figure 5A:
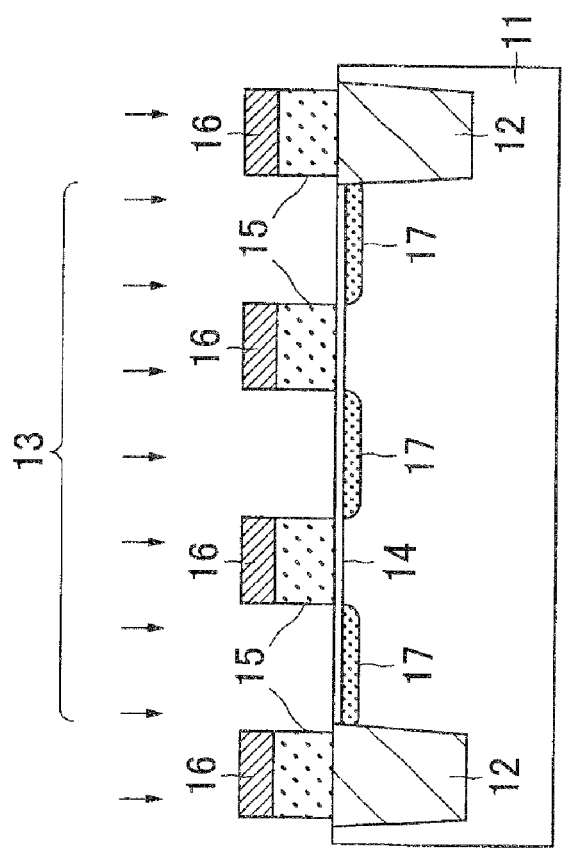
FIG. 5A is a schematic cross sectional view along line P-P in FIG. 1 showing the process for manufacturing the DRAM array (specifically forming LDD regions) according to the first embodiment of the present invention.

As shown in FIGS. 5A and 5B, LDD (Lightly Doped Drain) regions 17 of the cell transistor are then formed by using the gate cap insulation films 16 and the gate electrodes 15 as masks for ion implantation of an impurity having the opposite conductivity type from the impurity in the silicon substrate 11 into the exposed surfaces of the active regions 13 in the regions not covered by the gate cap insulation films 16 and the gate electrodes 15. In the formation of the LDD regions 17, about $5\times10^{12}$ to $1\times10^{14}$ cm$^{-2}$ of phosphorous (P) at an implantation energy of 10 to 40 kev, or about $5\times10^{12}$ to $1\times10^{14}$ cm$^{-2}$ of arsenic (AS) at an implantation energy of 5 to 30 keV may be implanted into the p-type silicon substrate 11 via the gate oxide films 14 formed on the surfaces of the active regions 13.

As shown in FIGS. 6A and 6B, side wall insulation films 18 for protecting the surfaces on both sides of the gate electrodes 15 are then formed. In the formation of the side wall insulation films 18, a silicon nitride film having a thickness of about 20 to 30 nm is formed on the entire surface of the substrate, and the silicon nitride film is then subjected to anisotropic etching (etching back), whereby the silicon nitride film is allowed to remain only on the side surfaces of the gate electrodes 15 and the gate cap insulation films 16. The gate oxide films 14 on the exposed surfaces of the active regions 13 are also removed by this etching back operation. The side wall insulation films 18 are thus formed and the gate electrodes 15 are covered by protective insulation films composed of the gate cap insulation films 16 and the side wall insulation films 18.

Figure 7B:
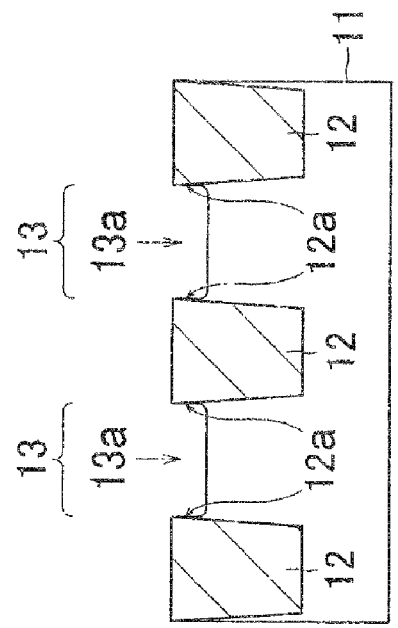
FIG. 7B is a schematic cross sectional view along line Q-Q in FIG. 1 showing the process for manufacturing the DRAM array (specifically deepening the active regions) according to the first embodiment of the present invention.
Figure 7A:
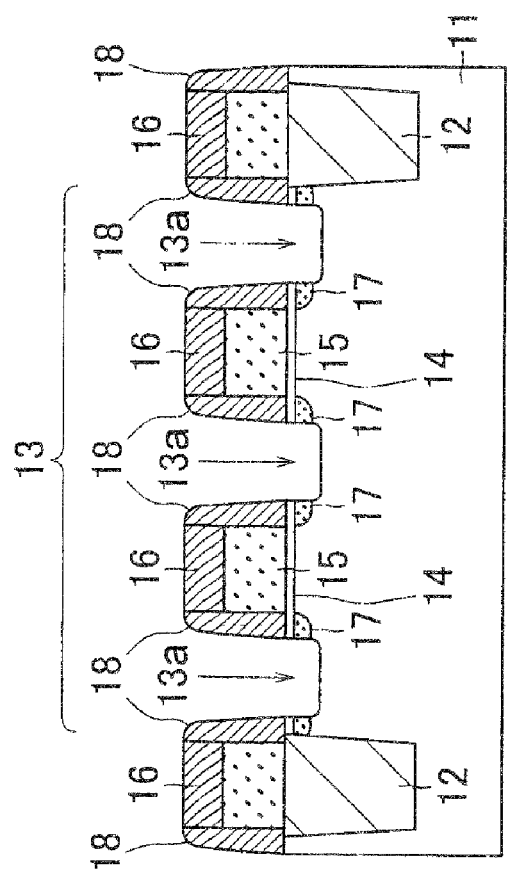
FIG. 7A is a schematic cross sectional view along line P-P in FIG. 1 showing the process for manufacturing the DRAM array (specifically deepening the active regions) according to the first embodiment of the present invention.

As shown in FIGS. 7A and 7B, recessed parts 13a are then formed in the exposed surfaces of the active regions 13 by using the gate cap insulation films 16 and the side wall insulation films 18 as masks to deepen the exposed surfaces of the active regions 13 by dry or wet etching in the regions not covered by the gate cap insulation films 16 and the side wall insulation films 18. The depth of the recessed parts 13a is preferably 20 nm to 50 nm, and more preferably 30 to 40 nm. The reason for selecting this depth is that the effect obtained by deepening the exposed surfaces is inadequate when the recessed parts 13a are too shallow, and the silicon epitaxial layers are difficult to form when the recessed parts are too deep. The side surface portions 12a of the field oxide films constituting the element isolation regions 12 are thereby exposed, and the ends in the width direction of the active regions 13 in the periphery of the recessed parts 13a are surrounded by the side surface portions 12a of the field oxide films, as shown in FIG. 7B. Specifically, a portion of the internal wall surfaces of the recessed parts 13a is formed by the side surface portions 12a. The side surface portions 12a of the field oxide films constituting the element isolation regions 12 correspond to the dam insulation.

Figure 8A:
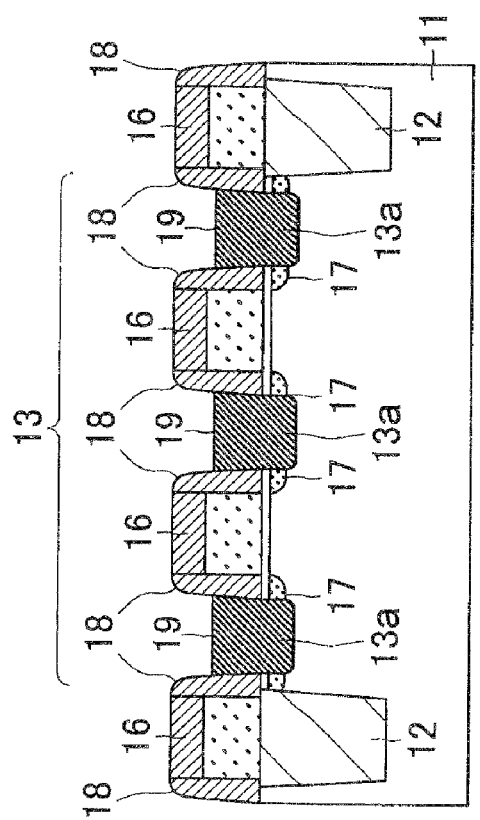
FIG. 8A is a schematic cross sectional view along line P-P in FIG. 1 showing the process for manufacturing the DRAM array (specifically forming silicon epitaxial layer) according to the first embodiment of the present invention.
Figure 8B:
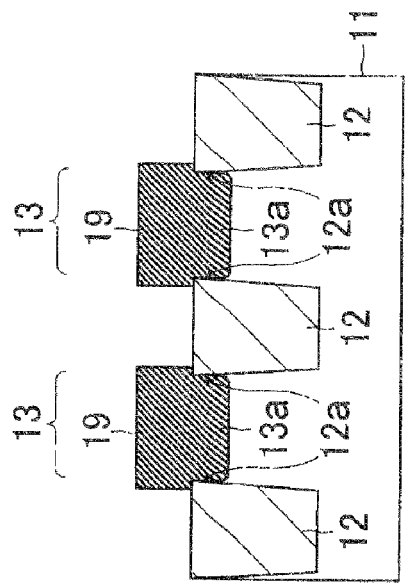
FIG. 8B is a schematic cross sectional view along line Q-Q in FIG. 1 showing the process for manufacturing the DRAM array (specifically forming silicon epitaxial layer) according to the first embodiment of the present invention.

As shown in FIGS. 8A and 8B, silicon epitaxial layers 19 are then formed by selective epitaxial growth on the exposed surfaces of the active regions 13 in which the recessed parts 13a are formed. The silicon epitaxial layers 19 may be formed in a state in which phosphorous (P), arsenic (As), and other impurities are not included therein, or in a state in which such impurities are included therein. As shown in FIG. 7B, the exposed surfaces of the active regions 13 are etched down, and the ends in the width direction of the active regions 13 are surrounded by the side surface portions 12a of the field oxide films (element isolation regions 12). Growth of the silicon epitaxial layers 19 in the transverse direction is therefore suppressed. Accordingly, as shown in FIG. 8B, silicon epitaxial layers 19, 19 that are adjacent to each other in the Y direction can be reliably separated. The width of the silicon epitaxial layers 19 in the Y direction is preferably about 120 to 160 nm; the thickness of the silicon epitaxial layers 19 is preferably about 30 to 80 nm; and the isolation margin between the silicon epitaxial layers 19, 19 adjacent in the Y direction is preferably about 30 nm.

Figures 9A, 9B:
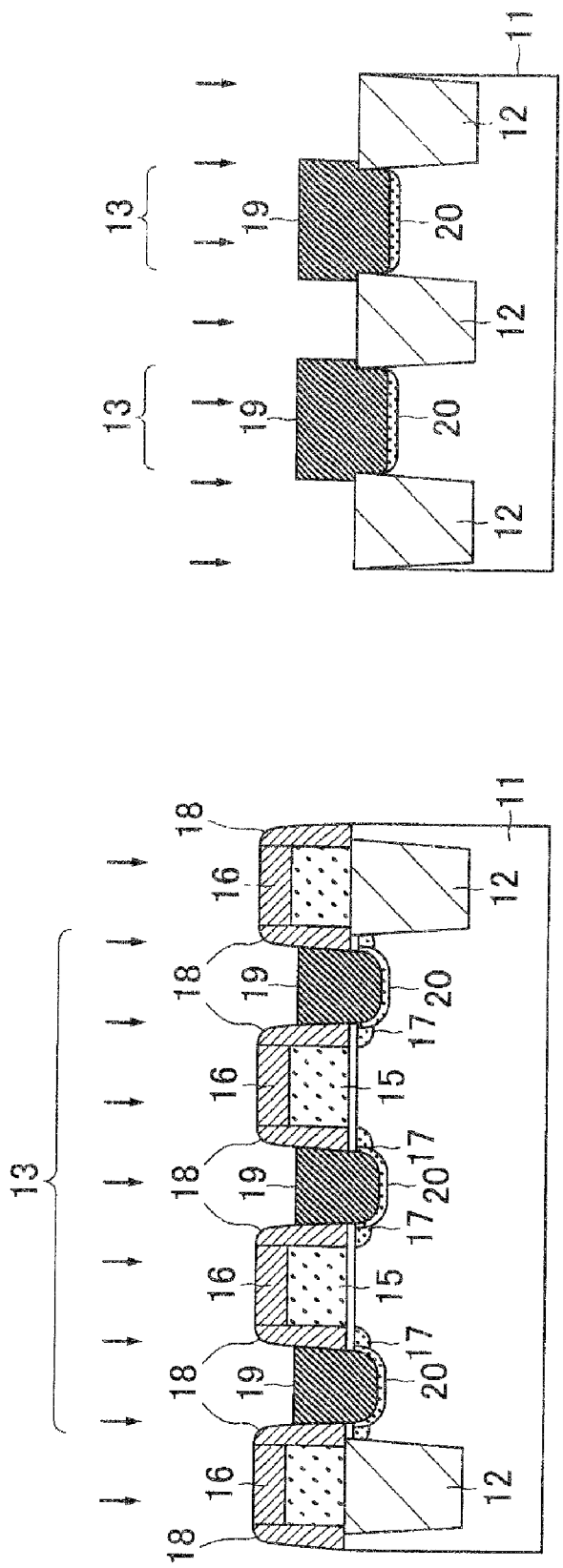
FIG. 9A is a schematic cross sectional view along line P-P in FIG. 1 showing the process for manufacturing the DRAM array (specifically forming impurity diffusion regions) according to the first embodiment of the present invention.
FIG. 9B is a schematic cross sectional view along line Q-Q in FIG. 1 showing the process for manufacturing the DRAM array (specifically forming impurity diffusion regions) according to the first embodiment of the present invention.

As shown in FIGS. 9A and 9B, impurity diffusion regions 20 are then formed within the silicon epitaxial layers 19 by the additional ion implantation of an impurity having the opposite conductivity type from the impurity in the silicon substrate 11. For the sake of convenience, FIGS. 9A and 9B show the impurity diffusion regions 20 formed so as to extend to the silicon substrate under the silicon epitaxial layers 19, but there is no need for the impurity diffusion regions 20 to extend to such a depth. Taking into account the heat treatment performed in a subsequent step, the depth may be adjusted so that connections to the LDD regions 17 are ultimately formed. In the formation of the impurity diffusion regions 20, about $5 \times 10^{12}$ to $1 \times 10^{14}$ cm$^{-2}$ of phosphorous (P) at an implantation energy of 10 to 40 keV, or about $5 \times 10^{12}$ to $1 \times 10^{14}$ cm$^{-2}$ of arsenic (AS) at an implantation energy of 5 to 30 keV may be implanted into the p-type silicon substrate 11 via the silicon epitaxial layers 19. The impurity diffusion regions 20 thus formed are the source/drain regions of the cell transistor.

As shown in FIGS. 10A and 10B, contact plugs (cell contacts) 22 are then formed above the silicon epitaxial layers 19. In the formation of the cell contacts 22, an interlayer insulating film 21a composed of BPSG (Boro-Phospho Silicate Glass) having a prescribed thickness is first formed on the entire surface of the substrate. Contact holes that penetrate through the interlayer insulating film 21a are then formed above the silicon epitaxial layers 19 by photolithography and dry etching using a resist mask. The cell contacts 22 are then formed by filling the contact holes with DOPOS or another electrically conductive material. The cell contacts 22 thus formed are electrically connected to the impurity diffusion regions 20, which are the source/drain regions of the memory cell transistor, and the connection is made via the silicon epitaxial layers 19.

Assembly of the DRAM memory cell transistor is thereby completed. The DRAM of the present embodiment is then completed by forming interlayer insulation films 21b through 21e, the bit line contact 23, bit lines 24, storage node contacts 25, storage capacitors 26, and other components in an upper layer of the memory cell transistor as shown in FIG. 11. The lower electrodes of the storage capacitors 26 are preferably formed from HSG (Hemi-spherical Silicon Grain), as shown in the drawing, in order to increase the capacity of the storage capacitors 26.

According to the present embodiment as described above, recessed parts are formed on the exposed surfaces of active regions, whereby the side surface portions of the field oxide films constituting the element isolation regions serves as dam insulation films that surround a portion of the periphery of the exposed surfaces of the active regions, and growth of the silicon epitaxial layers in the transverse direction is suppressed. It is therefore possible to prevent short-circuiting between silicon epitaxial layers that are adjacent to each other.

The peripheral circuit regions of the DRAM may have a structure such as the one described below.

Figure 12:
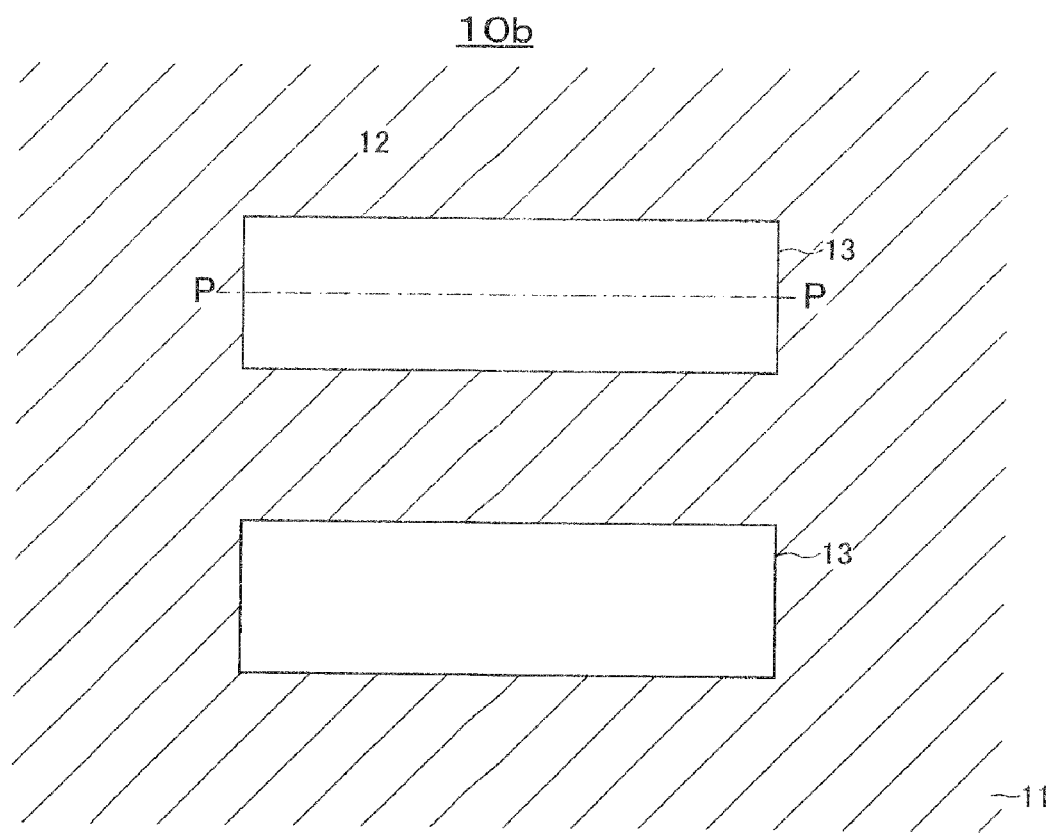
FIG. 12 is a schematic plain view showing the planar layout of the peripheral circuit region.

FIGS. 12 through 23 are diagrams showing the process for manufacturing the DRAM peripheral circuit regions, wherein the manufacturing process is contrasted with that of the memory array regions. Specifically, FIG. 12 is a schematic plain view; FIGS. 13A through 23A are schematic cross-sectional views along line P-P of the memory array 10a, the same as in FIGS. 2A through 10A; and FIGS. 13B through 23B are sectional views along line P-P of the peripheral circuit regions 10b.

Figure 13B:
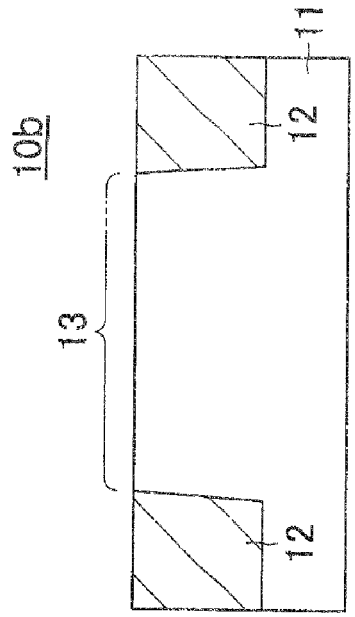
FIG. 13B is a schematic cross-sectional view along line P-P showing the process for manufacturing the peripheral circuit regions 10b in DRAM (specifically forming element isolation regions)
Figure 13A:
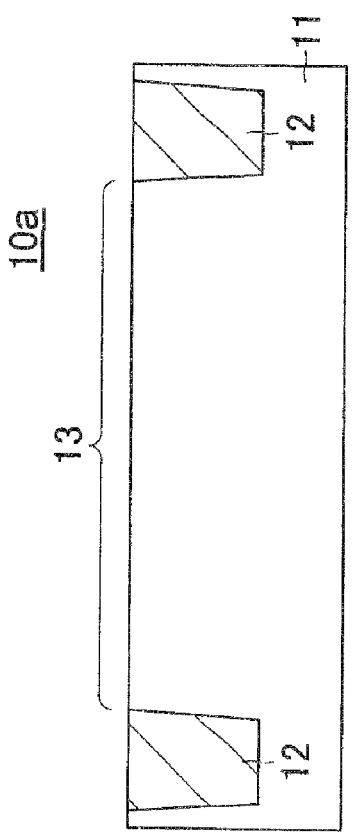
FIG. 13A is a schematic cross-sectional view along line P-P showing the process for manufacturing the memory array regions 10a in DRAM (specifically forming element isolation regions)
Figure 14B:
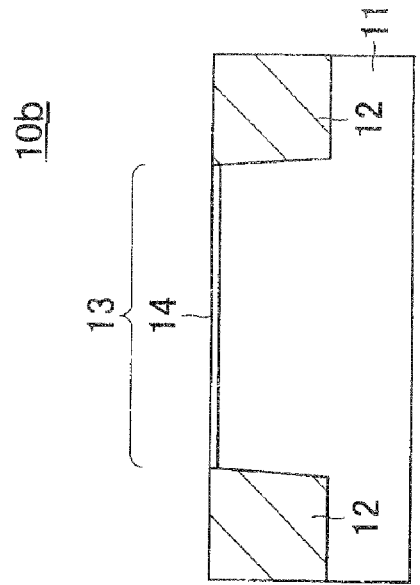
FIG. 14B is a schematic cross-sectional view along line P-P showing the process for manufacturing the peripheral circuit regions 10b in DRAM (specifically forming gate oxide films)
Figure 14A:
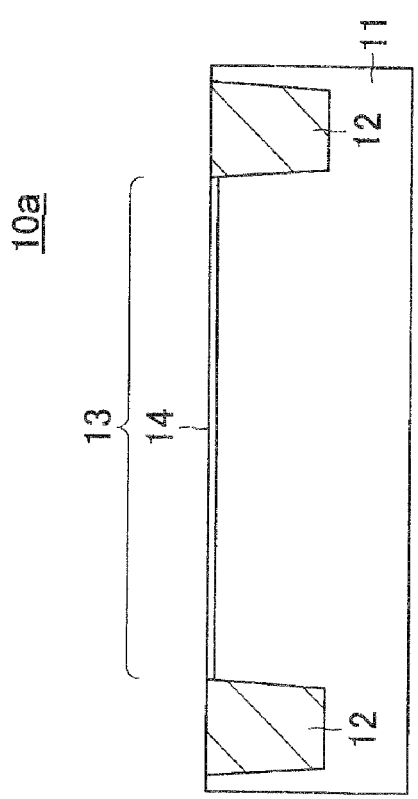
FIG. 14A is a schematic cross-sectional view along line P-P showing the process for manufacturing the memory array regions 10a in DRAM (specifically forming gate oxide films)
Figure 15A:
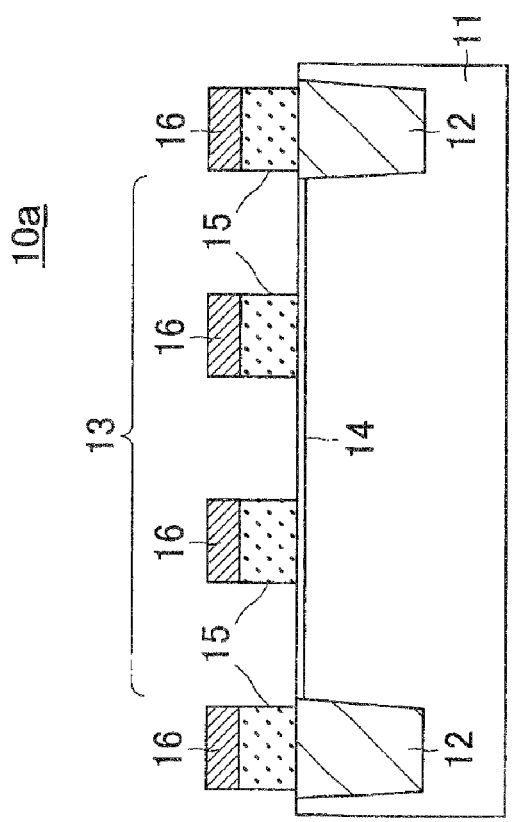
FIG. 15A is a schematic cross-sectional view along line P-P showing the process for manufacturing the memory array regions 10a in DRAM (specifically forming gate electrodes and gate cap insulation films)
Figure 15B:
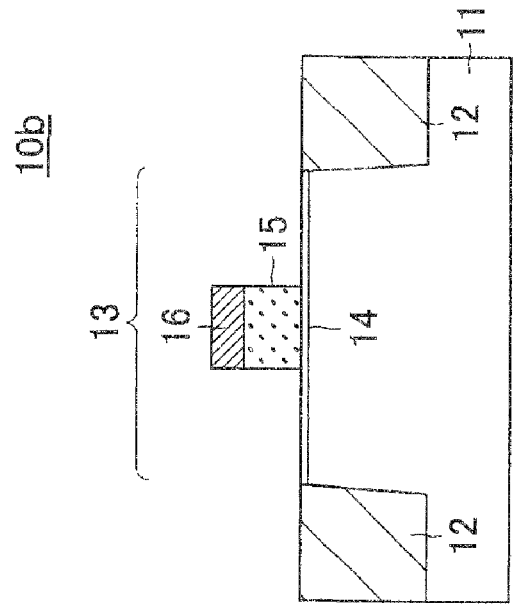
FIG. 15B is a schematic cross-sectional view along line P-P showing the process for manufacturing the peripheral circuit regions 10b in DRAM (specifically forming gate electrodes and gate cap insulation films)
Figure 16B:
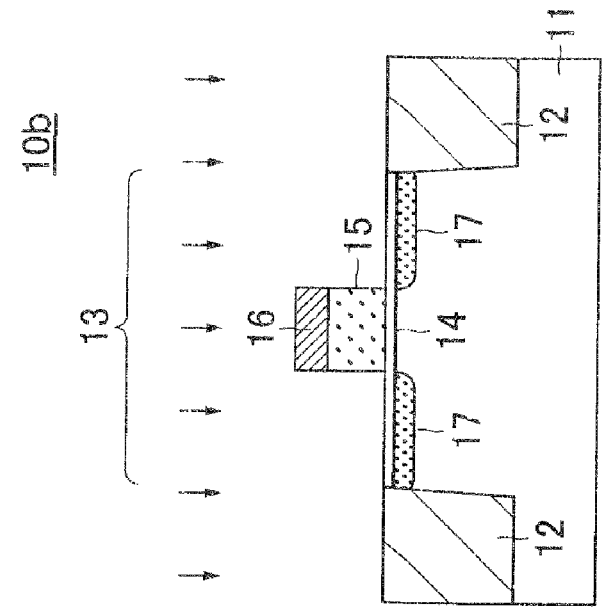
FIG. 16B is a schematic cross-sectional view along line P-P showing the process for manufacturing the peripheral circuit regions 10b in DRAM (specifically forming LDD regions)
Figure 16A:
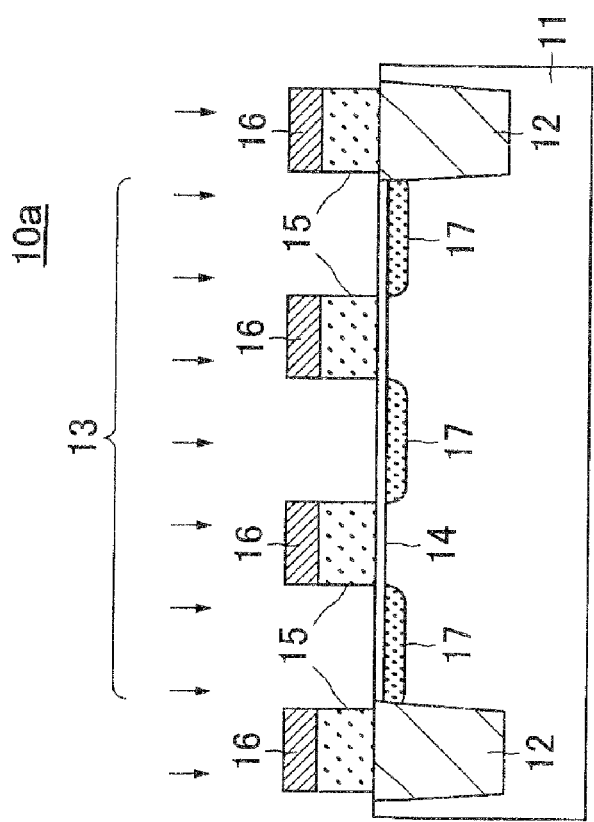
FIG. 16A is a schematic cross-sectional view along line P-P showing the process for manufacturing the memory array regions 10a in DRAM (specifically forming LDD regions)
Figure 17B:
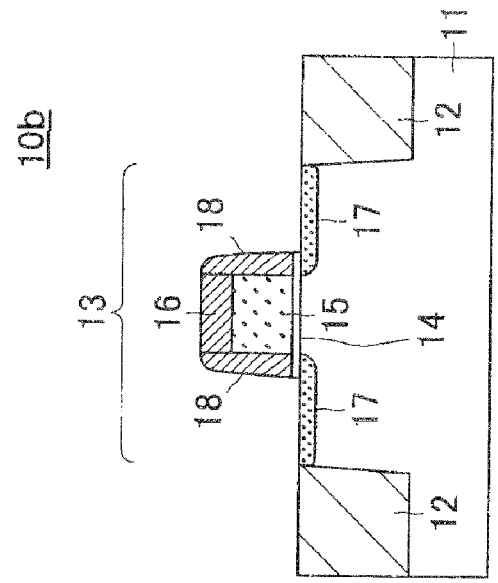
FIG. 17B is a schematic cross-sectional view along line P-P showing the process for manufacturing the peripheral circuit regions 10b in DRAM (specifically forming side wall insulation films)
Figure 17A:
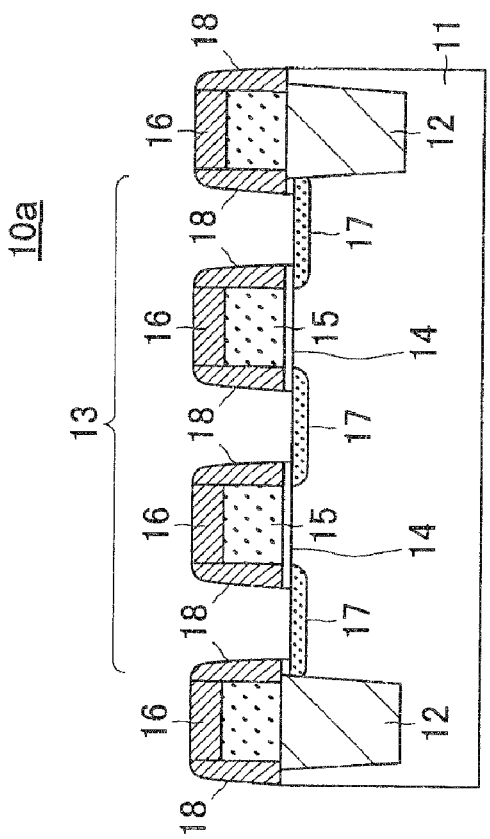
FIG. 17A is a schematic cross-sectional view along line P-P showing the process for manufacturing the memory array regions 10a in DRAM (specifically forming side wall insulation films)

The peripheral circuit regions 10b of the DRAM 10 are manufactured by a process in which an element isolation region 12 is first formed on a p-type silicon substrate 11, whereby a plurality of active regions 13 is separated from each other as shown in FIGS. 12 and 13B. As shown in FIG. 12, the active regions 13 are substantially rectangular regions that are surrounded by the element isolation region 12, and have an adequately large surface area compared to the active regions 13 in the memory array 10a. As shown in FIG. 13, the active regions 13 in the peripheral circuit regions 10b are formed at the same time as the active regions 13 in the memory array 10a. The gate oxide films 14, the gate electrodes 15, the gate cap insulation films 16, the LDD regions 17, and the side wall insulation films 18 are then formed as shown in FIGS. 14 through 17, but the steps for forming these components are the same as the steps performed in the aforementioned memory array 10a, and therefore will not be described in detail.

Figure 18B:
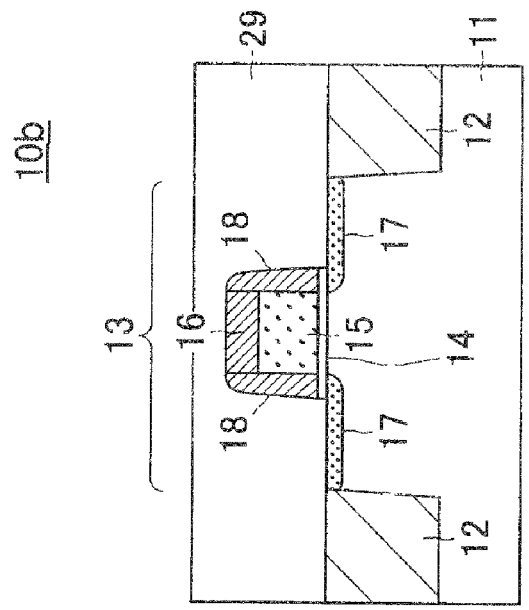
FIG. 18B is a schematic cross-sectional view along line P-P showing the process for manufacturing the peripheral circuit regions 10b in DRAM (specifically deepening the active regions)
Figure 18A:
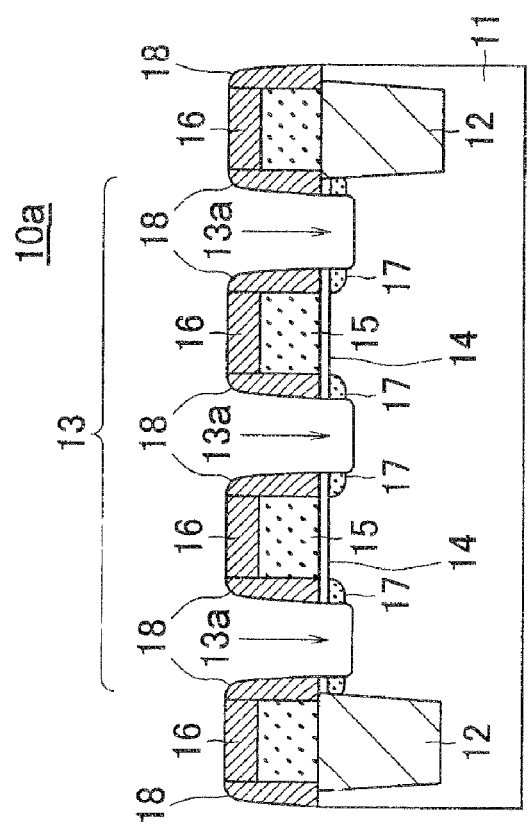
FIG. 18A is a schematic cross-sectional view along line P-P showing the process for manufacturing the memory array regions 10a in DRAM (specifically deepening the active regions)

As shown in FIG. 18, the exposed surfaces of the active regions 13 in the memory array 10a are then dry-etched or wet-etched down to form recessed parts 13a in the exposed surfaces of the active regions 13. However, such recessed parts are not formed in the peripheral circuit regions 10b, and flat active regions 13 are used. Therefore, a resist mask 29 is placed on the peripheral circuit regions 10b prior to etching the exposed surfaces of the active regions 13 in the memory array 10a, and the resist mask 29 is removed after etching is completed.

Figure 19B:
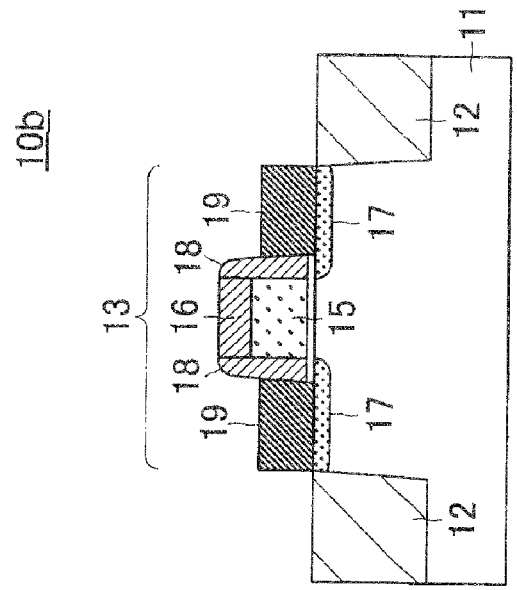
FIG. 19B is a schematic cross-sectional view along line P-P showing the process for manufacturing the peripheral circuit regions 10b in DRAM (specifically forming silicon epitaxial layer)
Figure 19A:
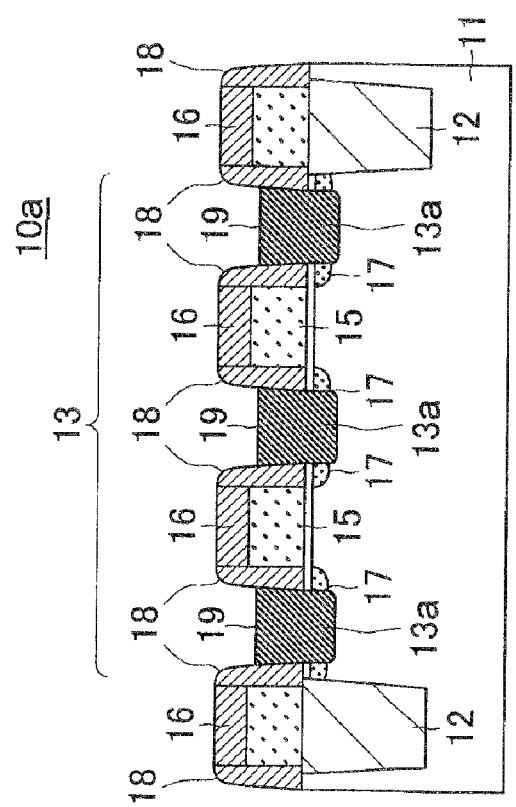
FIG. 19A is a schematic cross-sectional view along line P-P showing the process for manufacturing the memory array regions 10a in DRAM (specifically forming silicon epitaxial layer)

As shown in FIG. 19, silicon epitaxial layers 19 are then formed by selective epitaxial growth on the exposed surfaces of the active regions 13 in which the recessed parts 13a are formed. In contrast with the memory array 10a, the recessed parts 13a are not formed in the active regions 13 in the peripheral circuit regions 10b. Therefore, the element isolation regions 12 do not form barriers at the ends in the width direction of the active regions 13, and growth of the silicon epitaxial layers 19 proceeds in the transverse direction. However, because the adjacent silicon epitaxial layers 19, 19 in the peripheral circuit regions 10b are not close enough to each other to cause short-circuiting, the problems that occur in the memory array regions do not occur in the peripheral circuit regions 10b. Instead, since the surface area in the planar direction of the silicon epitaxial layers 19 can be increased by growth of the silicon epitaxial layers 19 in the transverse direction, advantages are gained in that the superposition margin of the metal contacts with respect to the silicon epitaxial layers 19 can be increased.

Figure 20B:
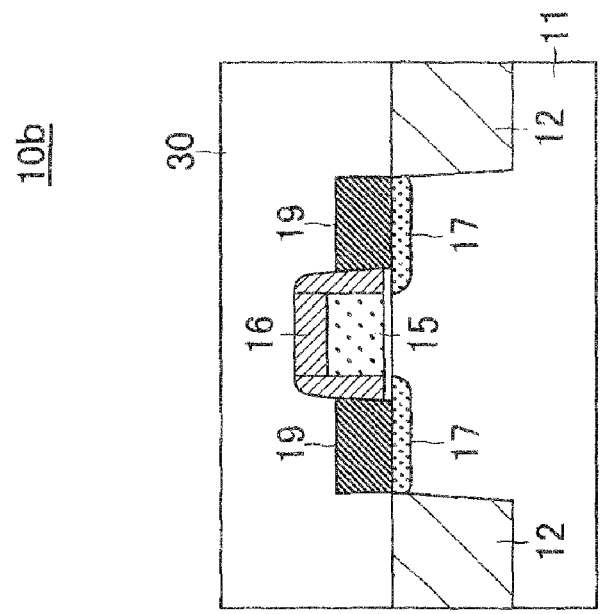
FIG. 20B is a schematic cross-sectional view along line P-P showing the process for manufacturing the peripheral circuit regions 10b in DRAM (specifically performing ion implantation)
Figure 20A:
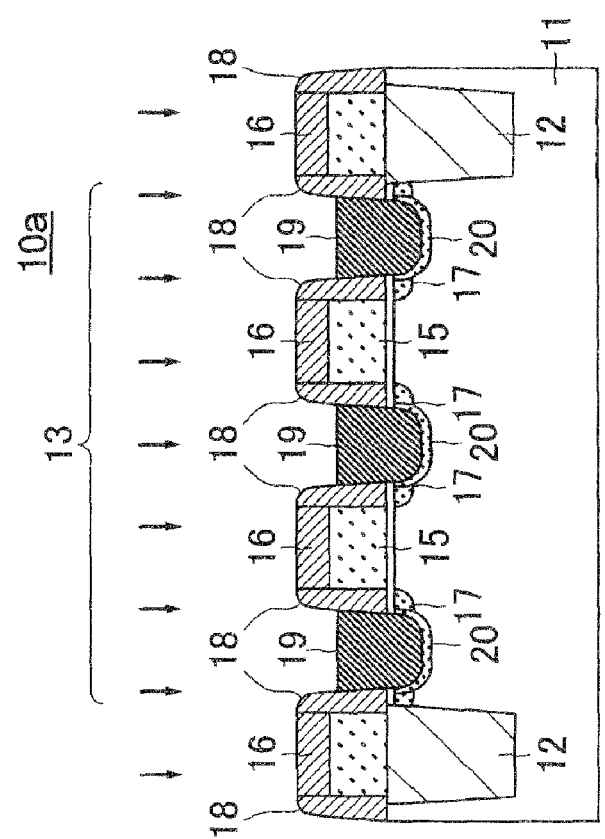
FIG. 20A is a schematic cross-sectional view along line P-P showing the process for manufacturing the memory array regions 10a in DRAM (specifically performing ion implantation)

As shown in FIG. 20, in a state in which the peripheral circuit regions 10b are covered by a photoresist 30, impurity diffusion regions 20 are formed by ion implantation of an impurity having the opposite conductivity type from the impurity in the silicon substrate 11 into the memory array 10a. The photoresist 30 is then removed.

Figure 21B:
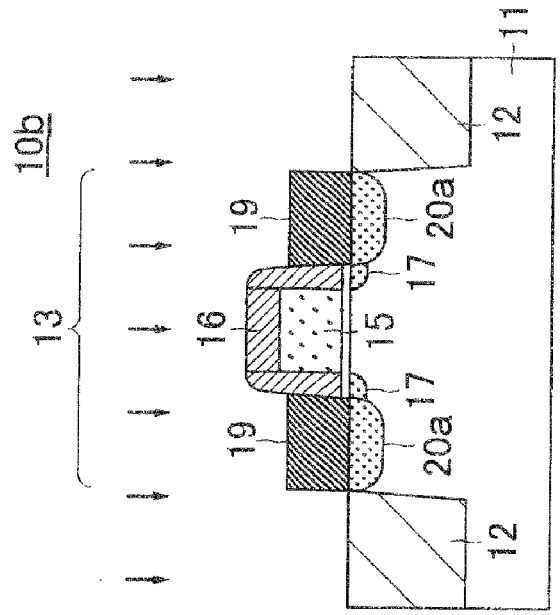
FIG. 21B is a schematic cross-sectional view along line P-P showing the process for manufacturing the peripheral circuit regions 10b in DRAM (specifically performing ion implantation)
Figure 21A:
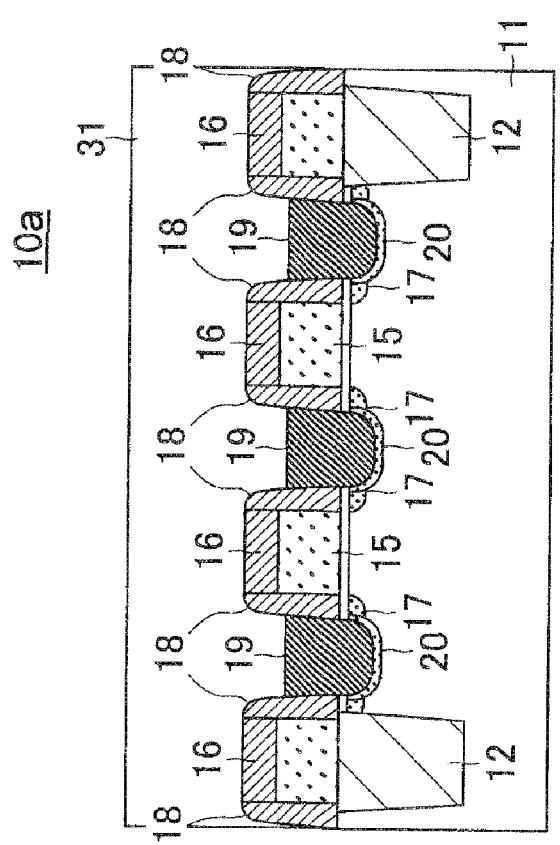
FIG. 21A is a schematic cross-sectional view along line P-P showing the process for manufacturing the memory array regions 10a in DRAM (specifically performing ion implantation)

Then, in a state in which the memory array 10a is covered by a photoresist 31, impurity diffusion regions 20a are formed by ion implantation of an impurity having the opposite conductivity type from the impurity in the silicon substrate 11 into the peripheral circuit regions 10b, as shown in FIG. 21. When the peripheral circuit regions 10b are composed of a combination of n-channel MOS transistor regions and p-channel MOS transistor regions, impurity diffusion regions 20a are formed in both types of transistor regions by repeating the step of implanting ions into the transistor regions of one type while the transistor regions of the other type are covered by a photoresist. About $1\times10^{15}$ to $5\times10^{15}$ $cm^{-2}$ of arsenic (As) at an implantation energy of 10 to 50 keV is implanted into the n-channel MOS transistor regions. About $1\times10^{15}$ to $5\times10^{15}$ $cm^{-2}$ of boron difluoride ($BF_2$) at an implantation energy of 10 to 30 keV is implanted into the p-channel MOS transistor regions.

Figure 22B:
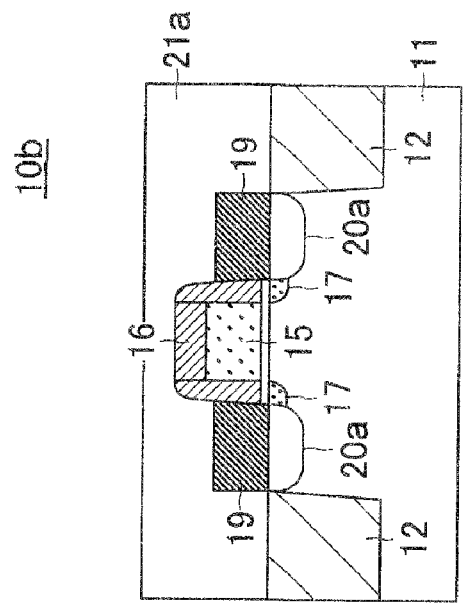
FIG. 22B is a schematic cross-sectional view along line P-P showing the process for manufacturing the peripheral circuit regions 10b in DRAM (specifically forming cell contacts)
Figure 22A:
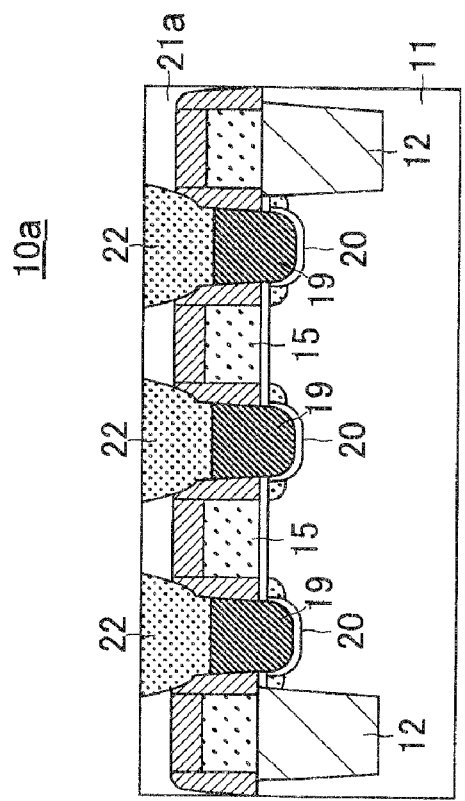
FIG. 22A is a schematic cross-sectional view along line P-P showing the process for manufacturing the memory array regions 10a in DRAM (specifically forming cell contacts)
Figure 23A:
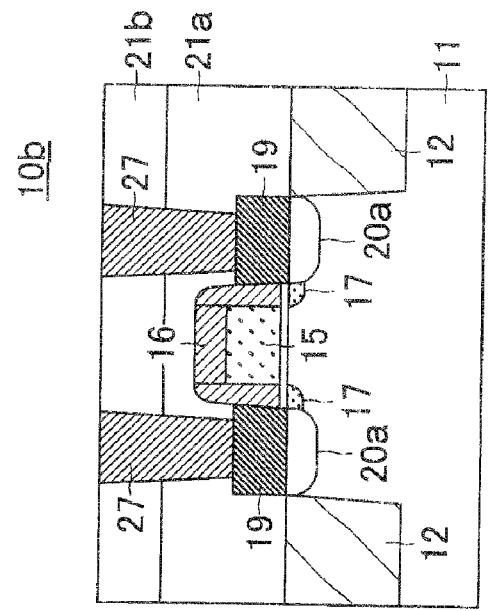
FIG. 23A is a schematic cross-sectional view along line P-P showing the process for manufacturing the memory array regions 10a in DRAM (specifically forming bit-line contacts and metal contacts)
Figure 23B:
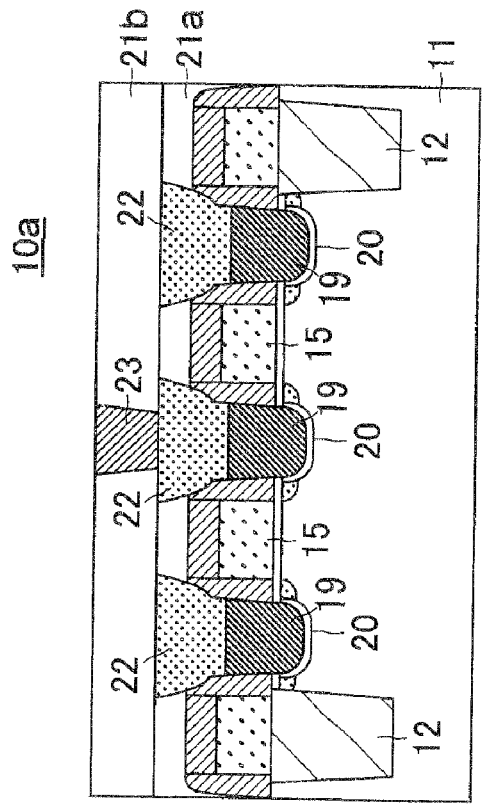
FIG. 23B is a schematic cross-sectional view along line P-P showing the process for manufacturing the peripheral circuit regions 10b in DRAM (specifically forming bit-line contacts and metal contacts)

Cell contacts 22 are then formed above the silicon epitaxial layers 19 of the memory array 10a, as shown in FIG. 22. The method for forming the cell contacts 22 is the same as the one shown in FIG. 10, and will not be described. The peripheral circuit regions 10b are covered by the interlayer insulating film 21a at this time.

As shown in FIG. 23, a bit line contact 23 is then formed in the memory array 10a, and metal contacts 27 are formed in the peripheral circuit regions 10b. An interlayer insulation film 21b composed of BPSG having a prescribed thickness is first formed on the entire surface of the substrate. Using lithography and dry etching, bit line contact holes that penetrate through the interlayer insulating films 21b are then formed in the memory cell region 10a, and the metal contact holes that penetrate through the interlayer insulation film 21a and 21b are formed at the same time as bit line contact holes in the peripheral circuit regions 10b. A bit line contact 23 is then formed in the memory array 10a, and metal contacts 27 are formed in the peripheral circuit regions 10b by filling the contact holes with tungsten or another reflactry metal material. The metal contacts 27 formed in this manner are electrically connected to the impurity diffusion regions 20a via the silicon epitaxial layers 19.

In the formation of the DRAM peripheral circuit regions 10b, the surface area of the silicon epitaxial layers 19 in the planar direction can be increased by not forming recessed parts in the impurity diffusion regions of the peripheral circuit transistor, and allowing the silicon epitaxial layers 19 to grow in the transverse direction. Accordingly, the superposition margin of the silicon epitaxial layers with respect to the metal contacts 27 can be adequately maintained.

A second embodiment of the present invention will next be described in detail. A silicon substrate having pillar-shaped active regions is used in the second embodiment.

FIGS. 24 through 39 are schematic cross sectional views showing the process for manufacturing the memory array region in DRAM as an example of the semiconductor device according to a second embodiment of the present invention. Specifically, the "A" diagrams in FIGS. 24 through 29 are cross sectional views along line P-P in FIG. 1; and the "B" diagrams of FIGS. 24 through 29 are cross sectional views along line Q-Q in FIG. 1.

Figure 24B:
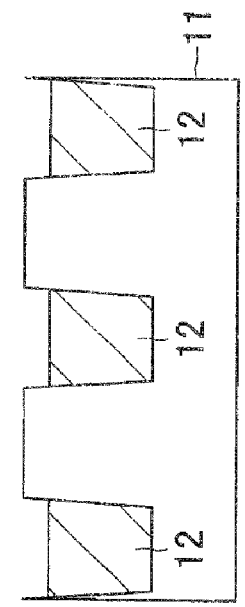
FIG. 24B is a schematic cross sectional view along line Q-Q in FIG. 1 showing the process for manufacturing the DRAM array (specifically forming pillar-type active regions) according to the second embodiment of the present invention.
Figure 24A:
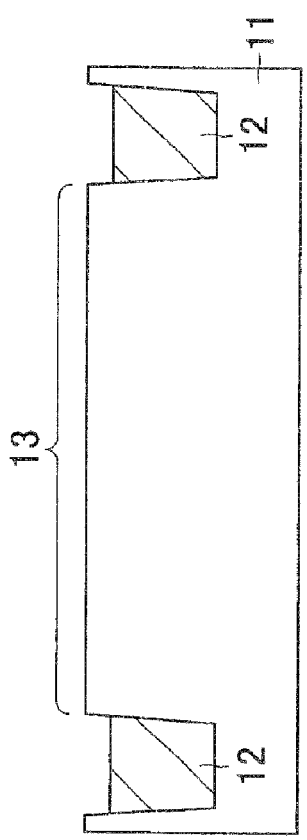
FIG. 24A is a schematic cross sectional view along line P-P in FIG. 1 showing the process for manufacturing the DRAM array (specifically forming pillar-type active regions) according to the second embodiment of the present invention.

In the manufacture of the memory array region of a DRAM 10, element isolation regions 12 are first formed by STI or another method on a p-type silicon substrate 11 in the same manner as in the first embodiment to form a plurality of active regions 13 that are separated from each other by the element isolation regions 12 (see FIGS. 1, 2A, and 2B). The surfaces of the active regions 13 are then caused to protrude beyond the element isolation regions 12 by a process in which the surface portions of the field oxide films constituting the element isolation regions 12 are removed by dry etching, and the element isolation regions 12 are deepened, as shown in FIGS. 24A and 24B. Pillar-shaped active regions 13 are thus formed on the silicon substrate 11. The amount of protrusion of the active regions 13 is preferably 10 to 30 nm, and more preferably 15 to 25 nm.

Figure 25B:
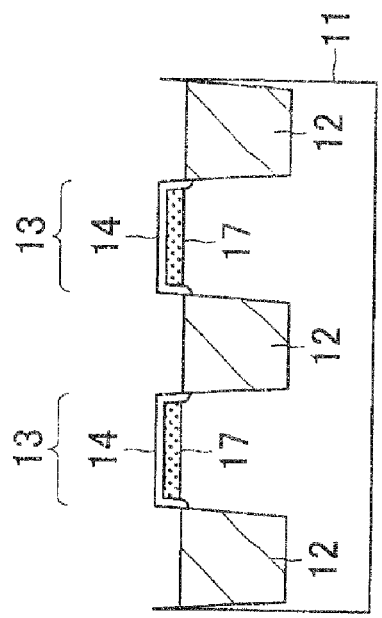
FIG. 25B is a schematic cross sectional view along line Q-Q in FIG. 1 showing the process for manufacturing the DRAM array (specifically forming gate oxide films and the like) according to the second embodiment of the present invention.
Figure 25A:
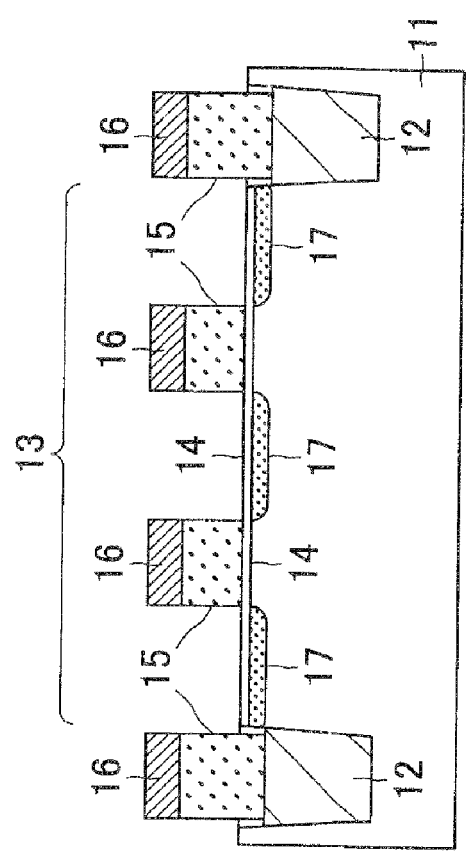
FIG. 25A is a schematic cross sectional view along line P-P in FIG. 1 showing the process for manufacturing the DRAM array (specifically forming gate oxide films and the like) according to the second embodiment of the present invention.

Gate oxide films 14, gate electrodes 15, gate cap insulation films 16, and LDD regions 17 are then formed in sequence in the same manner as in the first embodiment (see FIGS. 3 through 5), and a silicon substrate 11 having a structure such as the one shown in FIGS. 25A and 25B is formed.

Figure 26B:
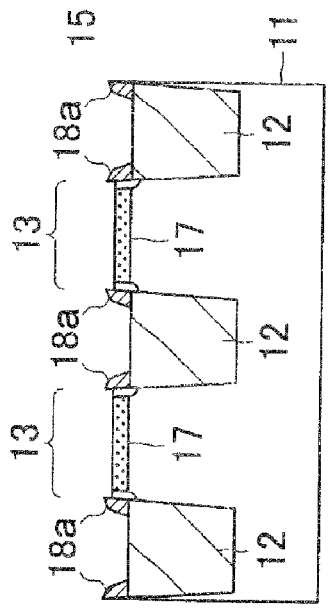
FIG. 26B is a schematic cross sectional view along line Q-Q in FIG. 1 showing the process for manufacturing the DRAM array (specifically forming side wall insulation films) according to the second embodiment of the present invention.
Figure 26A:
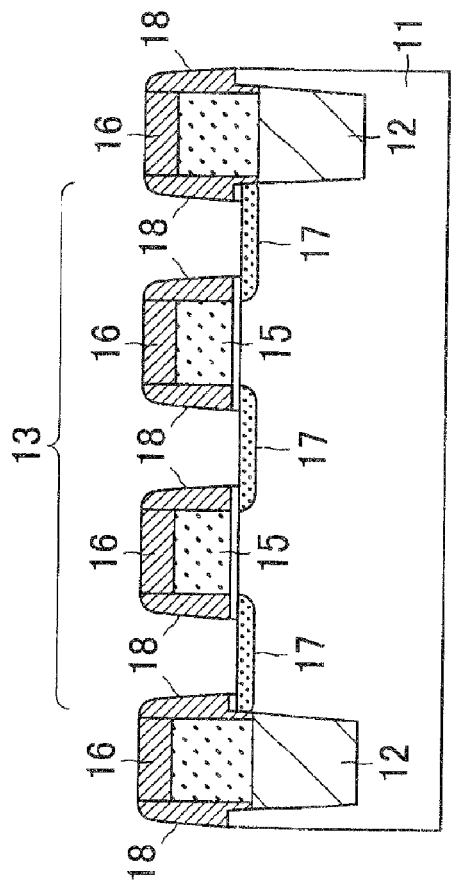
FIG. 26A is a schematic cross sectional view along line P-P in FIG. 1 showing the process for manufacturing the DRAM array (specifically forming side wall insulation films) according to the second embodiment of the present invention.

As shown in FIGS. 26A and 26B, side wall insulation films 18 for protecting the surfaces on both sides of the gate electrodes 15 are then formed. In the formation of the side wall insulation films 18, a silicon nitride film having a thickness of about 20 to 30 nm is formed on the entire surface of the substrate, and the silicon nitride film is then etched back in the same manner as in the first embodiment, whereby the silicon nitride film is allowed to remain only on the side surfaces of the gate electrodes 15 and the gate cap insulation films 16. The gate oxide films 14 on the exposed surfaces of the active regions 13 are also removed by this etching back process. Since the active regions 13 of the present embodiment are pillar-shaped and have planar surfaces as well as side surfaces, the silicon nitride film is also present on the peripheral edges of the active regions 13, as shown in the perspective view of FIG. 30A. Although a detailed description will be given hereinafter, the silicon nitride film in the present embodiment is used as a dam insulation film 18a for suppressing growth of the silicon epitaxial layers in the transverse direction.

Figure 27A:
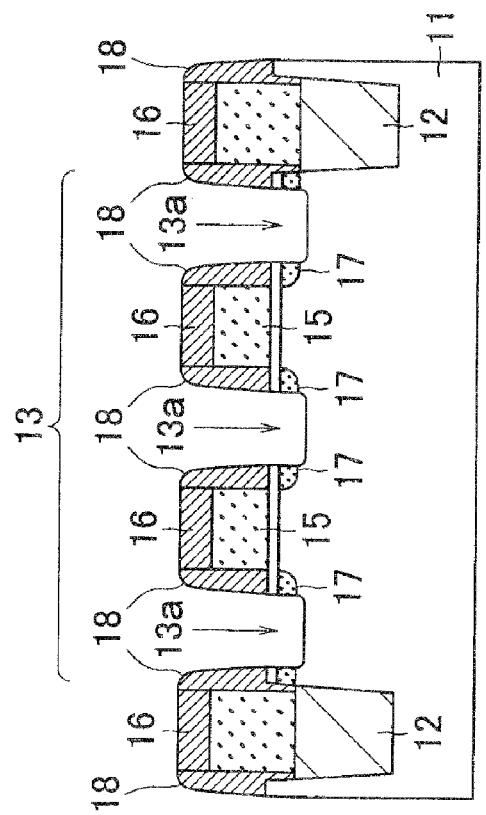
FIG. 27A is a schematic cross sectional view along line P-P in FIG. 1 showing the process for manufacturing the DRAM array (specifically deepening the active regions) according to the second embodiment of the present invention.
Figure 27B:
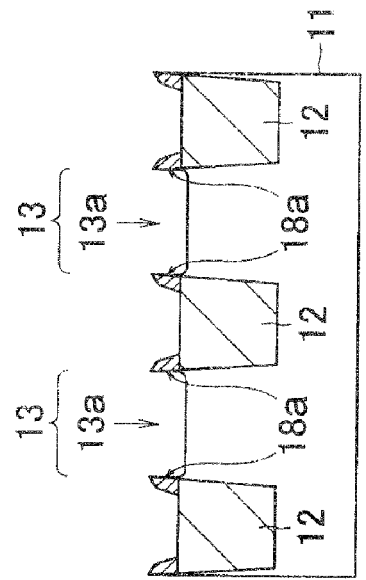
FIG. 27B is a schematic cross sectional view along line Q-Q in FIG. 1 showing the process for manufacturing the DRAM array (specifically deepening the active regions) according to the second embodiment of the present invention.
Figure 30A:
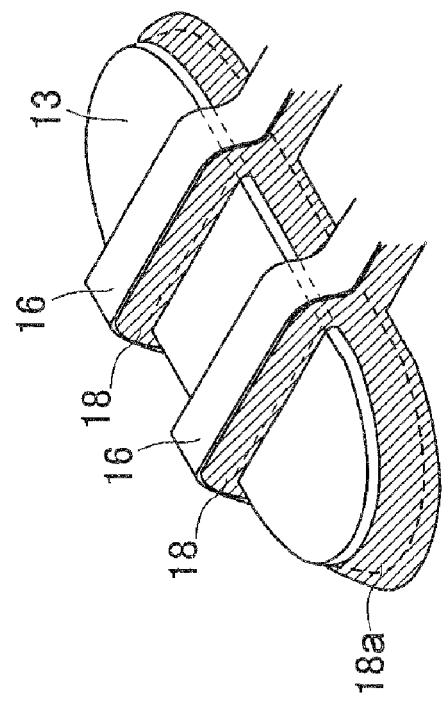
FIG. 30A is a schematic perspective view showing the process for manufacturing the DRAM array according to the second embodiment of the present invention.
Figure 30B:
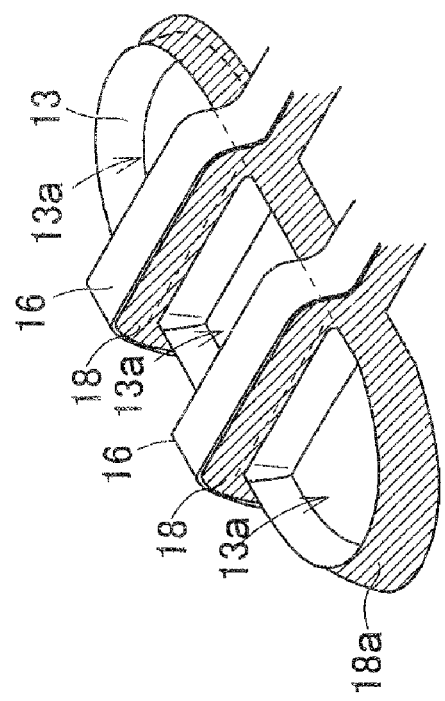
FIG. 30B is a schematic perspective view showing the process for manufacturing the DRAM array according to the second embodiment of the present invention.

As shown in FIGS. 27A, 27B, and 30B, recessed parts 13a are then formed in the exposed surfaces of the active regions 13 by using the gate cap insulation films 16 and the side wall insulation films 18 as masks to deepen the exposed surfaces of the active regions 13 by dry or wet etching in the regions not covered by the gate cap insulation films 16 and the side wall insulation films 18. In the present embodiment in particular, the surfaces of the active regions 13 are etched down so as to be lower than the dam insulation film 18a, but there is no need to make the active regions 13 lower than the element isolation regions 12, as in the first embodiment. The depth of the recessed parts 13a is preferably 20 nm to 40 nm, and more preferably 25 to 35 nm. This configuration creates a state in which the ends in the width direction of the active regions 13 in the periphery of the recessed parts 13a are surrounded by the dam insulation film 18a.

As shown in FIGS. 28A and 28B, silicon epitaxial layers 19 are then formed by selective epitaxial growth on the exposed surfaces of the active regions 13 in which the recessed parts 13a are formed. The silicon epitaxial layers 19 formed on the pillar-shaped active regions herein grow easily in the transverse direction, but the silicon epitaxial layers 19 are surrounded by a silicon nitride film (dam insulation film) formed together with the side wall insulation films 18 at the ends in the width direction of the active regions, and growth of the silicon epitaxial layers 19 in the transverse direction is therefore suppressed. Accordingly, as shown in FIG. 28B, silicon epitaxial layers 19, 19 that are adjacent to each other in the Y direction can be reliably separated.

Figure 29B:
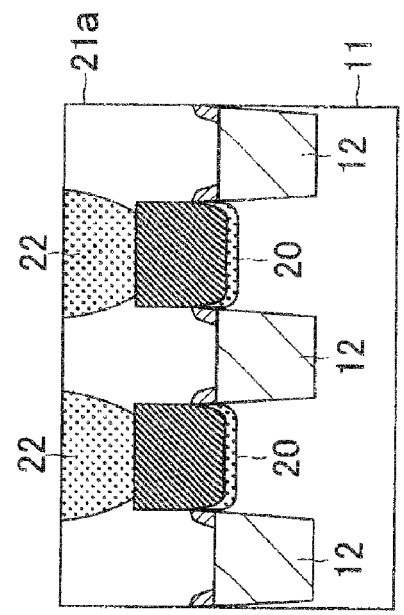
FIG. 29B is a schematic cross sectional view along line Q-Q in FIG. 1 showing the process for manufacturing the DRAM array (specifically forming impurity diffusion layer and cell contacts) according to the second embodiment of the present invention.
Figure 29A:
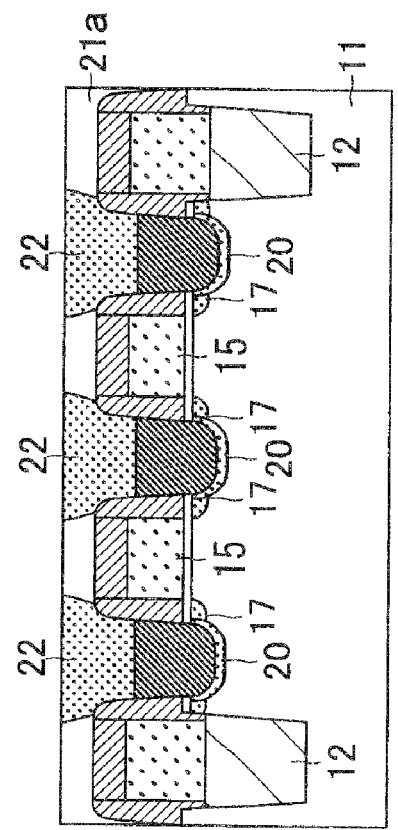
FIG. 29A is a schematic cross sectional view along line P-P in FIG. 1 showing the process for manufacturing the DRAM array (specifically forming impurity diffusion layer and cell contacts) according to the second embodiment of the present invention.

Assembly of the DRAM memory cell transistor shown in FIG. 29 is then completed by forming impurity diffusion regions 20 and cell contacts 22 in sequence in the same manner as in the first embodiment. The DRAM of the present embodiment is then completed by forming interlayer insulation films 21b through 21d, the bit line contact 23, bit lines 24, storage node contacts 25, storage capacitors 26, and other components in an upper layer of the cell transistor in the same manner as in the first embodiment.

According to the present embodiment as described above, recessed parts are formed on the exposed surfaces of pillar-shaped active regions, whereby the silicon nitride films remaining on the peripheral edges of the active regions during formation of the side wall insulation films serves as dam insulation films that surround a portion of the periphery of the exposed surfaces of the active regions, and growth of the silicon epitaxial layers in the transverse direction is suppressed. It is therefore possible to prevent short-circuiting between silicon epitaxial layers that are adjacent to each other.

The DRAM peripheral circuit region according to the second embodiment is manufactured in the same manner as in the first embodiment. In other words, the exposed surfaces of the active regions 13 in the memory array 10a are dry-etched or wet-etched down to form recessed parts 13a in the exposed surfaces of the active regions 13. However, such recessed parts 13a are not formed in the exposed surfaces of the active regions 13 in the peripheral circuit regions 10b, and flat active regions 13 are used without modification. Therefore, a resist mask is placed on the peripheral circuit regions 10b prior to etching the exposed surfaces of the active regions 13 in the memory array 10a, and the resist mask is removed after etching is completed.

As shown in FIG. 31, silicon epitaxial layers 19 are then formed by selective epitaxial growth on the exposed surfaces of the active regions 13 in which the recessed parts 13a are formed. In contrast with the memory array 10a, the recessed parts 13a herein are not formed in the active regions 13 in the peripheral circuit regions 10b. Therefore, the element isolation regions 12 do not form barriers at the ends in the width direction of the active regions 13, and growth of the silicon epitaxial layers 19 proceeds in the transverse direction. In the present embodiment in particular, since the active regions 13 are pillar-shaped, the silicon epitaxial layers 19 easily grow in the transverse direction. However, the surface area of the silicon epitaxial layers 19 in the planar direction can be increased, and the superposition margin of the silicon epitaxial layers with respect to the cell contacts can be adequately maintained by allowing the silicon epitaxial layers 19 to grow in the transverse direction.

A third embodiment of the present invention will next be described in detail. A silicon substrate having rounded active regions is used in the third embodiment.

FIGS. 32 through 37 are schematic cross sectional views showing the process for manufacturing the memory array region in DRAM as an example of the semiconductor device according to a third embodiment of the present invention. Specifically, the "A" diagrams of FIGS. 32 through 37 are sectional views along line P-P in FIG. 1, and the "B" diagrams in FIGS. 32 through 37 are cross sectional views along line Q-Q in FIG. 1.

Figure 32B:
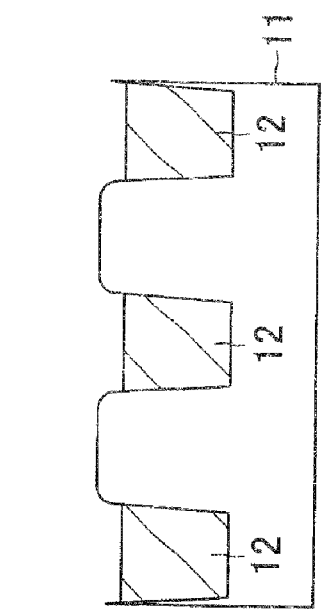
FIG. 32B is a schematic cross sectional view along line Q-Q in FIG. 1 showing the process for manufacturing the DRAM array (specifically forming rounded active regions) according to the third embodiment of the present invention.
Figure 32A:
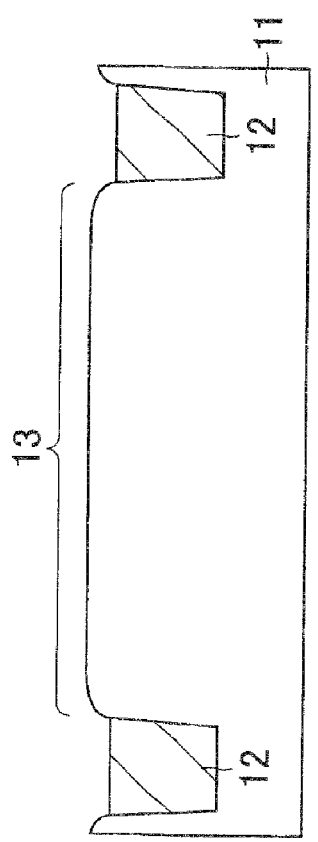
FIG. 32A is a schematic cross sectional view along line P-P in FIG. 1 showing the process for manufacturing the DRAM array (specifically forming rounded active regions) according to the third embodiment of the present invention.

In the manufacture of the memory array region of the DRAM 10, pillar-shaped active regions 13 are first formed on a p-type silicon substrate 11 in the same manner as in the second embodiment (see FIGS. 24A and 24B). The corner portions of the pillar-shaped active regions 13 are then rounded as shown in FIGS. 32A and 32B by annealing the silicon substrate 11 in a hydrogen atmosphere. Rounded active regions 13 are thereby formed on the silicon substrate 11. The amount of protrusion of the active regions 13 is preferably 10 to 30 nm, and more preferably 15 to 25 nm. Rounded active regions inhibit concentration of electric fields, and are therefore superior to pillar-shaped active regions in terms of the insulation withstand voltage.

Figure 33B:
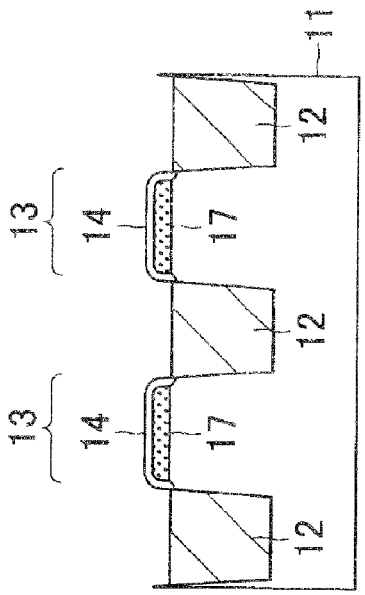
FIG. 33B is a schematic cross sectional view along line Q-Q in FIG. 1 showing the process for manufacturing the DRAM array (specifically forming gate oxide films and the like) according to the third embodiment of the present invention.
Figure 33A:
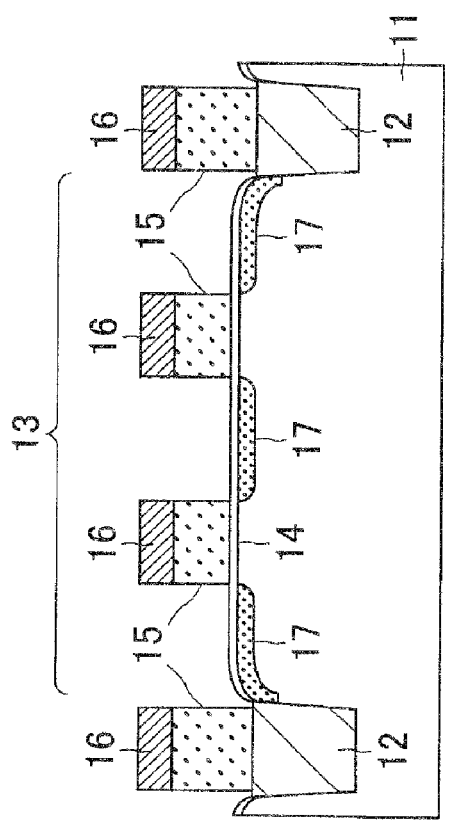
FIG. 33A is a schematic cross sectional view along line P-P in FIG. 1 showing the process for manufacturing the DRAM array (specifically forming gate oxide films and the like) according to the third embodiment of the present invention.

Gate oxide films 14, gate electrodes 15, gate cap insulation films 16, and LDD regions 17 are then formed in sequence in the same manner as in the first embodiment (see FIGS. 3 through 5), and a silicon substrate 11 having a structure such as the one shown in FIGS. 33A and 33B is formed.

Figure 34B:
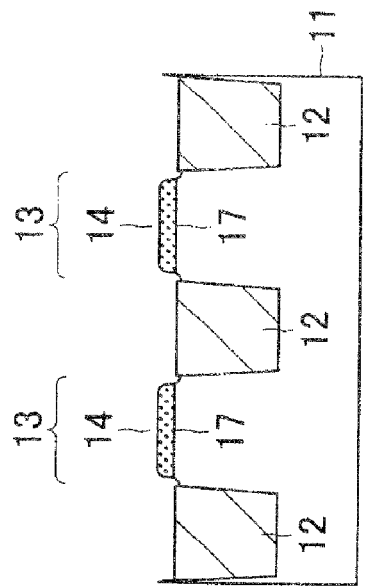
FIG. 34B is a schematic cross sectional view along line Q-Q in FIG. 1 showing the process for manufacturing the DRAM array (specifically forming side wall insulation films) according to the third embodiment of the present invention.
Figure 34A:
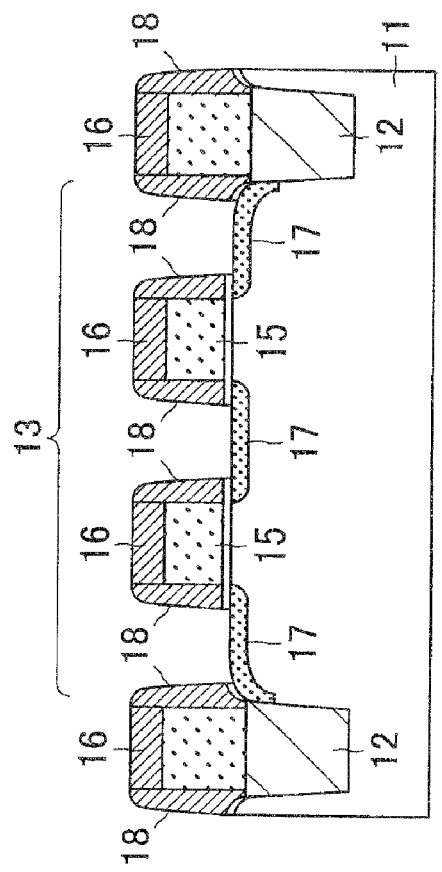
FIG. 34A is a schematic cross sectional view along line P-P in FIG. 1 showing the process for manufacturing the DRAM array (specifically forming side wall insulation films) according to the third embodiment of the present invention.

As shown in FIGS. 34A and 34B, side wall insulation films 18 for protecting the surfaces on both sides of the gate electrodes 15 are then formed. In the formation of the side wall insulation films 18, a silicon nitride film having a thickness of about 20 to 30 nm is formed on the entire surface of the substrate, and the silicon nitride film is then etched back in the same manner as in the first embodiment, whereby the silicon nitride film is allowed to remain only on the side surfaces of the gate electrodes 15 and the gate cap insulation films 16. The gate oxide films 14 on the exposed surfaces of the active regions 13 are also removed by this etching back operation. The active regions 13 of the present embodiment are rounded and have planar surfaces and side surfaces, but the side surfaces have a gradual incline instead of the pillar shape of the second embodiment. Accordingly, the silicon nitride film is not present at the peripheral edges of the active regions 13.

Figure 35B:
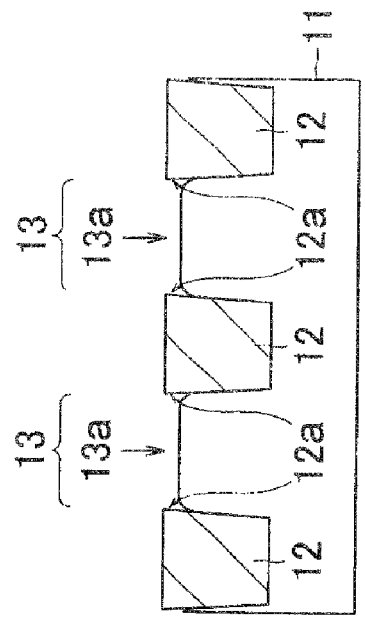
FIG. 35B is a schematic cross sectional view along line Q-Q in FIG. 1 showing the process for manufacturing the DRAM array (specifically deepening the active regions) according to the third embodiment of the present invention.
Figure 35A:
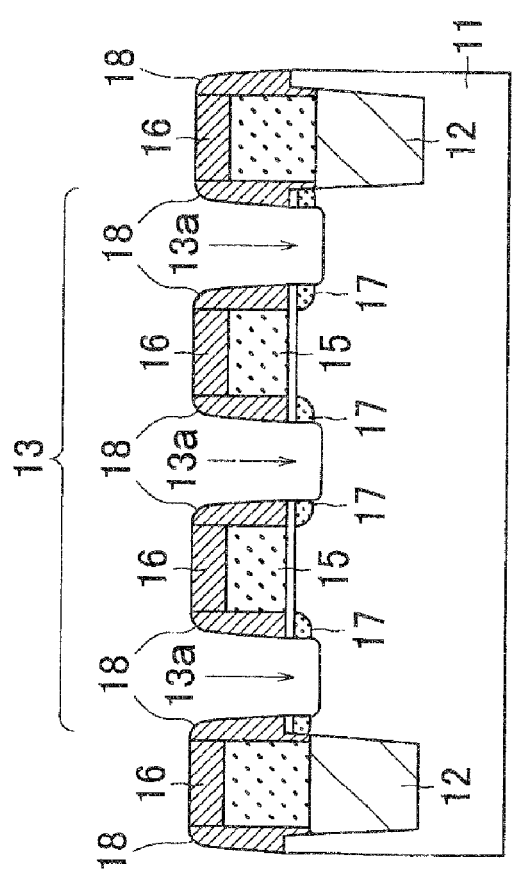
FIG. 35A is a schematic cross sectional view along line P-P in FIG. 1 showing the process for manufacturing the DRAM array (specifically deepening the active regions) according to the third embodiment of the present invention.

As shown in FIGS. 35A and 35B, recessed parts 13a are then formed in the exposed surfaces of the active regions 13 by using the gate cap insulation films 16 and the side wall insulation films 18 as masks to deepen the exposed surfaces of the active regions 13 by dry or wet etching in the regions not covered by the gate cap insulation films 16 and the side wall insulation films 18. In the present embodiment in particular, the surfaces of the active regions 13 are etched down so as to be lower than the surface of the element isolation regions 12. The depth of the recessed parts 13a is preferably 20 nm to 50 nm, and more preferably 30 to 40 nm. This configuration creates a state in which the side surface portions 12a of the field oxide films constituting the element isolation regions 12 are exposed, and the ends in the width direction of the active regions 13 in the periphery of the recessed parts 13a are surrounded by the side surface portions 12a of the field oxide films, as shown in FIG. 35B. Specifically, a state occurs in portions of the inner wall surfaces of the recessed parts 13a are formed by the side surface portions 12a.

Figure 36B:
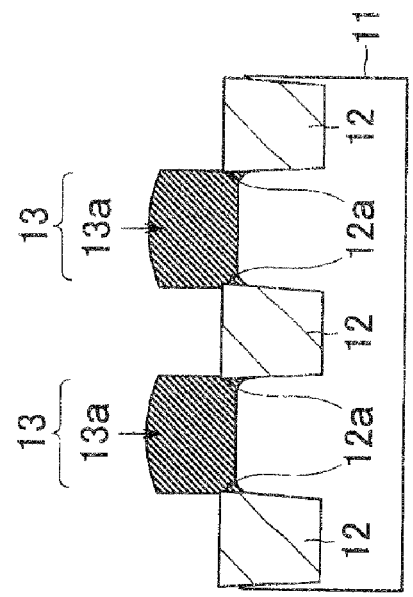
FIG. 36B is a schematic cross sectional view along line Q-Q in FIG. 1 showing the process for manufacturing the DRAM array (specifically forming silicon epitaxial layer) according to the third embodiment of the present invention.
Figure 36A:
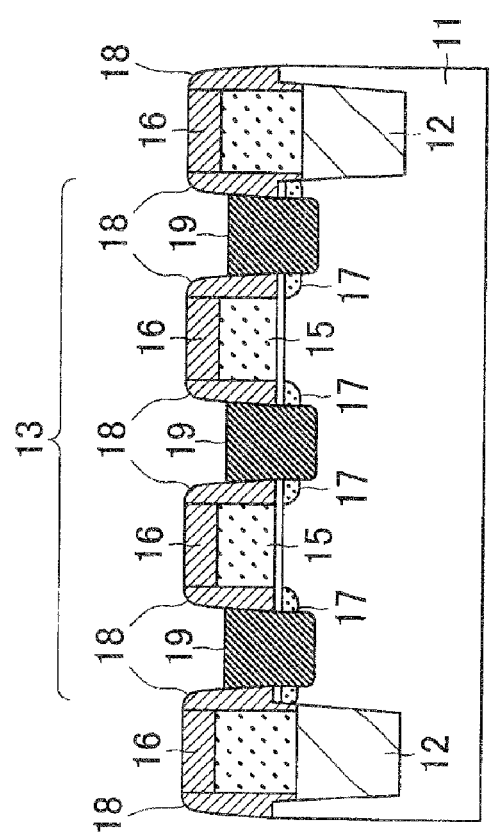
FIG. 36A is a schematic cross sectional view along line P-P in FIG. 1 showing the process for manufacturing the DRAM array (specifically forming silicon epitaxial layer) according to the third embodiment of the present invention.

As shown in FIGS. 36A and 36B, Silicon epitaxial layers 19 are then formed by selective epitaxial growth on the exposed surfaces of the active regions 13 in which the recessed parts 13a are formed. When the active regions 13 are rounded, the silicon epitaxial layers 19 grow easily in the transverse direction, but the ends in the width direction of the active regions 13 are surrounded by the side surface portions 12a of the field oxide films, and growth of the silicon epitaxial layers 19 in the transverse direction is therefore suppressed. Accordingly, as shown in FIG. 36B, silicon epitaxial layers 19, 19 that are adjacent to each other in the Y direction can be reliably separated.

Figure 37B:
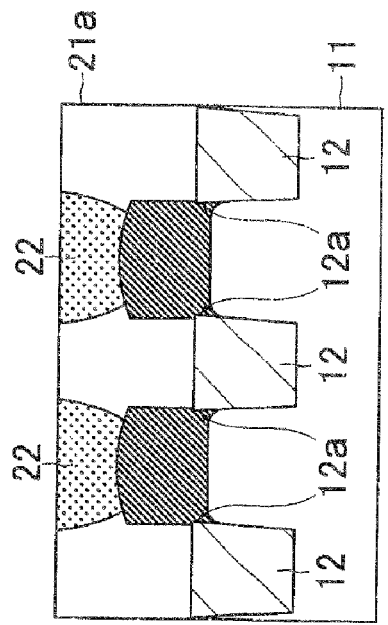
FIG. 37B is a schematic cross sectional view along line Q-Q in FIG. 1 showing the process for manufacturing the DRAM array (specifically forming impurity diffusion layer and cell contacts) according to the third embodiment of the present invention.
Figure 37A:
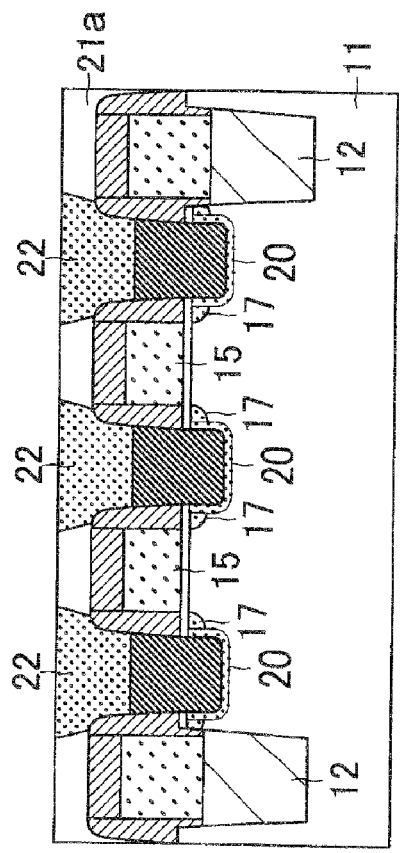
FIG. 37A is a schematic cross sectional view along line P-P in FIG. 1 showing the process for manufacturing the DRAM array (specifically forming impurity diffusion layer and cell contacts) according to the third embodiment of the present invention.

Assembly of the DRAM memory cell transistor shown in FIGS. 37A and 37B is then completed by forming impurity diffusion regions 20 and cell contacts 22 in sequence in the same manner as in the first embodiment. The DRAM of the present embodiment is then completed by forming interlayer insulation films 21b through 21d, the bit line contact 23, bit lines 24, storage node contacts 25, storage capacitors 26, and other components in an upper layer of the cell transistor in the same manner as in the first embodiment.

According to the present embodiment as described above, recessed parts are formed on the exposed surfaces of rounded active regions, whereby the side surface portions of the silicon nitride films constituting the element isolation regions serves as dam insulation films that surround a portion of the periphery of the exposed surfaces of the active regions, and growth of the silicon epitaxial layers in the transverse direction is suppressed. It is therefore possible to prevent short-circuiting between silicon epitaxial layers that are adjacent to each other.

The DRAM peripheral circuit region according to the third embodiment is manufactured in the same manner as in the first embodiment. In other words, the exposed surfaces of the active regions 13 in the memory array 10*a* are dry-etched or wet-etched down to form recessed parts 13*a* in the exposed surfaces of the active regions 13. However, such recessed parts 13*a* are not formed for the peripheral circuit regions 10*b*, and flat active regions 13 are used. Therefore, a resist mask is placed on the peripheral circuit regions 10*b* prior to etching the exposed surfaces of the active regions 13 in the memory array 10*a*, and the resist mask is removed after etching is completed.

Figure 38A:
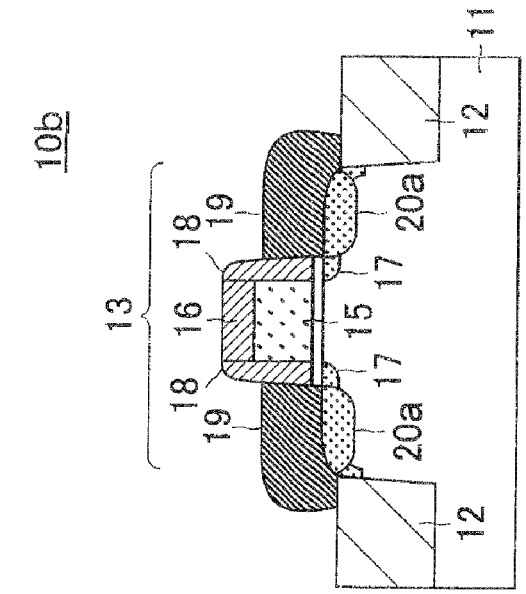
FIG. 38A is a schematic cross sectional view along line P-P in FIG. 1 showing the process for manufacturing the DRAM array according to the third embodiment of the present invention.
Figure 38B:
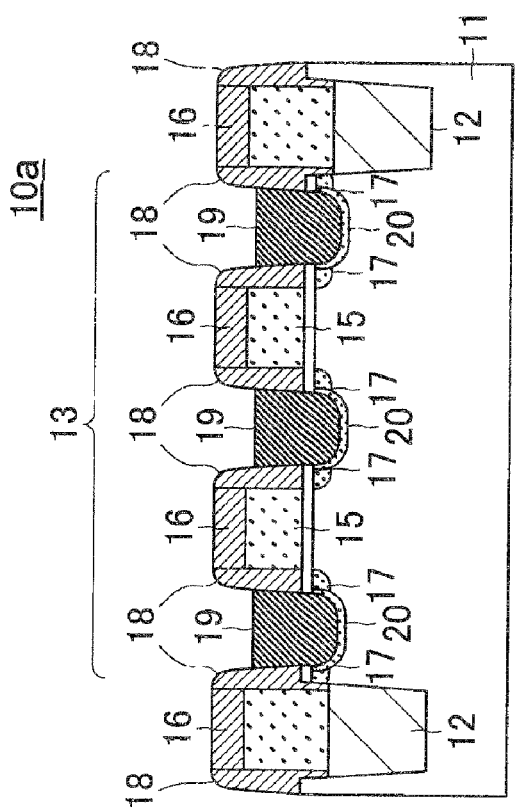
FIG. 38B is a schematic cross sectional view along line Q-Q in FIG. 1 showing the process for manufacturing the DRAM array according to the third embodiment of the present invention.
Figure 39:
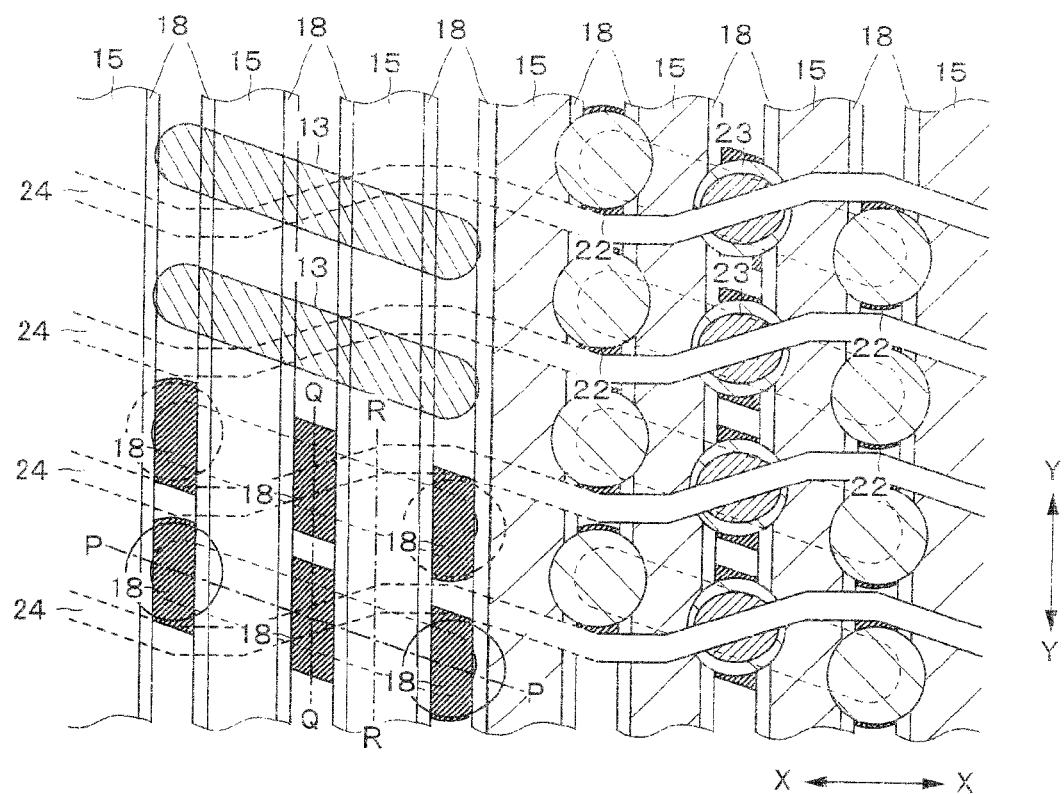
FIG. 39 is a schematic plain view showing the planar layout of a conventional DRAM cell transistor.

As shown in FIG. 38, silicon epitaxial layers 19 are then formed by selective epitaxial growth on the exposed surfaces of the active regions 13 in which the recessed parts 13*a* are formed. In contrast with the memory array 10*a*, the recessed parts 13*a* herein are not formed in the active regions 13 in the peripheral circuit regions 10*b*. Therefore, the element isolation regions 12 do not form barriers at the ends in the width direction of the active regions 13, and growth of the silicon epitaxial layers 19 proceeds in the transverse direction. In the present embodiment in particular, since the active regions 13 are pillar-shaped, the silicon epitaxial layers 19 easily grow in the transverse direction. However, the surface area of the silicon epitaxial layers 19 in the planar direction can be increased, and the superposition margin of the silicon epitaxial layers with respect to the cell contacts can be adequately maintained by allowing the silicon epitaxial layers 19 to grow in the transverse direction.

The present invention has thus been shown and described with reference to specific embodiments. However, it should be noted that the present invention is in no way limited to the details of the described arrangements but changes and modifications may be made without departing from the scope of the appended claims.

For example, cases were described in the abovementioned embodiments in which active regions 13 that were angled approximately 18 degrees in relation to the X direction were arranged in a straight line in the longitudinal direction of the active regions 13, and were also arranged at equal intervals with respect to the Y direction as shown in FIG. 1. However, the present invention is not limited to such a layout and may be applied to various other field layouts. The examples described in the abovementioned embodiments were also of a DRAM cell having a cell area of $6F^2$, but the present invention may be applied to a DRAM cell that has a cell area other than $6F^2$.

The LDD regions 17 were also formed in the active regions 13 in the abovementioned embodiments, but formation of the LDD regions 17 is not essential in the present invention. Since impurity diffusion regions 20 were formed in the abovementioned embodiments, ions of phosphorus (P) or arsenic (As) were implanted, but an ion implantation step is not essential to the present invention. For example, an impurity in the silicon epitaxial layers 19 may be diffused in the active regions 13 by another heat treatment step, or an impurity included in the DOPOS films constituting the cell contacts 22 may be diffused in the active regions 13 via the silicon epitaxial layers 19.

What is claimed is:

1. A method, comprising:
    selectively forming an isolation region in a semiconductor substrate to define a memory array region and a peripheral circuit region, the memory array region including a first active region for a memory cell transistor of a first channel type, the peripheral circuit region including second and third active regions respectively for first and second peripheral transistors, the first peripheral transistor being of the first channel type, the second peripheral transistor being of a second channel type that is different from the first channel type, each of the first, second, and third active regions including a channel formation portion and source and drain formation portions;
    forming a first gate structure on the channel formation portion of the first active region and second and third gate structures respectively on the channel formation portions of the second and third active regions, the first gate structure being for the memory cell transistor, the second gate structure being for the first peripheral transistor, the third gate structure being for the second peripheral transistor, each of the first, second, and third gate structures comprising a gate insulating film and a gate electrode formed on the gate insulating film;
    removing respective parts of the source and drain formation portions of the first active region to form recesses respectively in the source and drain formation portions of the first active region, the removing the respective parts of the source and drain formation portions of the first active region being carried out while protecting respective parts of the source and drain formation portions of the second and third active regions from being removed; and
    performing epitaxial growth to form epitaxial layers in the recesses of the source and drain formation portions of the first active regions and on the source and drain formation regions of each of the second and third active regions.

2. The method as claimed in claim 1, wherein the first channel type is an N channel type and the second channel type is a P channel type.

3. The method as claimed in claim 1, wherein each of the first, second, and third gate structures further comprises sidewall insulating films formed on respective side walls of the gate electrode, and the removing the respective parts of the source and drain formation portions of the first active region is carried out by using the first gate structure as a mask.

4. The method as claimed in claim 1, further comprising:
    introducing first impurities in the source and drain regions of the first and second active regions to form source and drain regions of the memory cell transistor and the first peripheral transistor while masking the third active region; and
    introducing second impurities in the source and drain regions of the third active region to form source and drain regions of the second peripheral transistor while masking the first and second active regions;
    each of the introducing the first impurities and the introducing the second impurities being carried out prior to the removing the respective parts of the source and drain formation portions of the first active region.

5. The method as claimed in claim 4, further comprising:
    introducing third impurities in the epitaxial layers formed in the recesses of the source and drain regions of the first active region and on the source and drain regions of the second active region while masking the third active region; and
    introducing fourth impurities in the epitaxial layers formed on the source and drain regions of the third active region while masking the first and second active regions.

* * * * *